(12) United States Patent
Loering et al.

(10) Patent No.: US 7,463,423 B2
(45) Date of Patent: Dec. 9, 2008

(54) LITHOGRAPHY PROJECTION OBJECTIVE, AND A METHOD FOR CORRECTING IMAGE DEFECTS OF THE SAME

(75) Inventors: Ulrich Loering, Oberkochen (DE); Vladan Blahnik, Aalen (DE); Wilhelm Ulrich, Aalen (DE); Daniel Kraehmer, Essingen (DE); Norbert Wabra, Werneck (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/955,662

(22) Filed: Dec. 13, 2007

(65) Prior Publication Data

US 2008/0144184 A1 Jun. 19, 2008

Related U.S. Application Data

(63) Continuation of application No. PCT/EP2006/005059, filed on May 26, 2006.

(60) Provisional application No. 60/690,544, filed on Jun. 14, 2005.

(51) Int. Cl.
*G02B 9/00* (2006.01)
*G03B 27/42* (2006.01)
*G03F 7/00* (2006.01)

(52) U.S. Cl. .............. 359/649; 355/53; 430/270.1

(58) Field of Classification Search ............ 355/53, 355/67; 359/649; 430/270.1
See application file for complete search history.

(56) References Cited

U.S. PATENT DOCUMENTS 7,209,292 B2 * 4/2007 Epple et al. .......... 359/649
7,310,187 B2 * 12/2007 Epple et al. .......... 359/649

FOREIGN PATENT DOCUMENTS

| DE | 102 10 899 | 9/2003 |
| EP | 1 431 826 | 6/2004 |
| EP | 1 610 361 | 12/2005 |
| WO | WO 03/077036 | 5/2002 |
| WO | WO 2004/086470 | 10/2004 |
| WO | WO 2006/009573 | 1/2006 |

* cited by examiner

*Primary Examiner*—David N Spector
(74) *Attorney, Agent, or Firm*—Fish & Richardson P.C.

(57) ABSTRACT

A lithography projection objective for imaging a pattern to be arranged in an object plane of the projection objective onto a substrate to be arranged in an image plane of the projection objective comprises a multiplicity of optical elements that are arranged along an optical axis of the projection objective. The optical elements comprise a first group, following the object plane, of optical elements, and a last optical element, which follows the first group and is next to the image plane and which defines an exit surface of the projection objective and is arranged at a working distance from the image plane. The projection objective is tunable or tuned with respect to aberrations for the case that the volume between the last optical element and the image plane is filled by an immersion medium with a refractive index substantially greater than 1. The position of the last optical element is adjustable in the direction of the optical axis. A positioning device is provided that positions at least the last optical element during immersion operation such that aberrations induced by disturbance are at least partially compensated.

40 Claims, 10 Drawing Sheets

LITHOGRAPHY PROJECTION OBJECTIVE, AND A METHOD FOR CORRECTING IMAGE DEFECTS OF THE SAME

CROSS REFERENCE TO RELATED APPLICATION

The present application is a continuation of pending International Patent application PCT/EP2006/005059 filed on May 26, 2006, which designates the Unites States and which claims priority of U.S. provisional application No. 60/690,544, filed Jun. 14, 2005.

BACKGROUND OF THE INVENTION

The invention relates to a lithography projection objective for imaging a pattern arranged in an object plane of the projection objective onto a substrate to be arranged in an image plane of the projection objective.

The invention further relates to a method for correcting image defects in the case of a lithography projection objective that can be tuned to immersion operation.

A projection objective of the type mentioned at the beginning is preferably used for microlithography projection exposure machines for producing semiconductor components and other finely structured subassemblies. A projection objective serves the purpose of projecting patterns from photomasks or graticules, which are also designated as masks or reticles, onto an object, that is to say a substrate, coated with a photosensitive layer, or onto a semiconductor wafer coated with photoresist, with very high resolution.

The resolution of the imaging of the pattern by the projection objective is proportional to the wavelength of the light used, and inversely proportional to the image-side numerical aperture of the projection objective. The resolution can therefore be improved with the aid of shorter wavelengths and higher numerical apertures. The numerical aperture NA is given by NA=n·sin Θ, n being the refractive index of the medium between the substrate and the last optical element of the projection objective.

Hitherto, use has predominantly been made of projection objectives in the case of which there exists in the image space between the exit surface of the last optical element of the projection objective and the image plane a finite working distance that is filled during operation with air or another suitable gas. Such systems are designated as "dry systems" or "dry objectives". The working distance between the last optical element and the substrate is generally filled in this case with helium, nitrogen or another gas or a gas mixture with a refractive index n of approximately 1.

It follows from the previously mentioned relationship between the resolution and the image-side numerical aperture that the resolution can be raised when an immersion medium of high refractive index is introduced into the working distance between the exit surface of the last optical element and the substrate. This technique is designated as immersion lithography. A projection objective of this type is also designated as an "immersion system" or "immersion objective". Some refractive projection objectives that are suitable for immersion lithography and have image-side numerical apertures NA>1 are disclosed in the patent applications DE 102 10 899 and PCT/EP 02/04846 of the same applicant.

A further advantage of an immersion objective consists in the possibility of obtaining a larger depth of field of the imaging in conjunction with the same numerical aperture as for a dry objective. This advantage is used in the projection objectives according to the invention.

In the case of an immersion objective, instead of being filled with a gas, the space between the exit surface of the last optical element of the projection objective and the substrate, which determines the working distance, is filled with an immersion medium of a refractive index substantially greater than 1. An immersion medium normally used at present is water, but it is possible, particularly within the scope of the present invention, to select other immersion media in accordance with needs and suitability.

Document EP 1 431 826 A2, which stems from the same applicant, describes how simple design means and manipulations can be used to tune a projection objective between a dry operation (dry configuration) and an immersion operation (immersion configuration). The projection objective described there has a multiplicity of optical elements that are arranged along an optical axis of the projection objective, the optical elements comprising a first group, following the object plane, of optical elements and a last optical element that follows the first group, is next to the image plane and defines an exit surface of the projection objective that is arranged at a working distance from the image plane. The last optical element is substantially free from refractive power and has no sag or only a slight one. The tuning method described there comprises varying the thickness of the last optical element, changing the refractive index of the space between the exit surface of the last optical element and the substrate by introducing or removing an immersion medium, and moreover preferably an axial displacement of the last optical element for the purpose of setting a suitable working distance in the dry operation of the projection objective. Moreover, it is provided to refine the tuning to the dry configuration or the immersion configuration by changing the air spaces between individual optical elements of the first group or by providing or varying aspheres.

The projection objective of the present invention can likewise be tuned between a dry configuration and an immersion configuration.

However, the present invention is based on a further aspect of such a projection objective that can be tuned between the dry configuration and the immersion configuration.

A temperature change usually occurs during operation of a projection objective. This can be global, homogenous or else local. For example, the air around the projection objective, the projection objective housing, the individual mounts of the optical elements, the optical elements themselves and the air or the gas inside the projection objective and, during immersion operation, the immersion liquid can heat up.

It has emerged that temperature changes have a different effect with regard to spherical image defects on a projection objective during immersion operation than on a projection objective in the dry configuration. In other words, dry objectives and immersion objectives differ from one another with regard to their sensitivity to temperature changes.

In the case of a projection objective in dry configuration, such spherical aberrations induced by temperature changes can be at least largely compensated even in the relatively high order by simply refocusing in which only the position of the substrate is adjusted in the direction of the optical axis. Specifically, a change in the working distance between the exit surface of the last optical element and the substrate leads in the case of a projection objective in dry configuration to very similar aberrations such as heating up of the projection objective, and so the aberrations induced by the heating up can be at least largely compensated by an appropriately directed displacement of the substrate, usually in conjunction with heating up, in a direction away from the last optical element.

It came out that this mode of procedure, specifically a correction of image defects on the basis of temperature changes solely by adjusting the position of the substrate does not lead in the case of a projection objective in immersion configuration to the result as in the case of a projection objective in dry configuration, that is to say in the case of such a focusing correction in which the Zernike coefficient Z4 is compensated to zero, higher spherical Zernike coefficients Z9, Z16, Z25, . . . remain and impair the imaging properties of the projection objective in immersion configuration.

SUMMARY OF THE INVENTION

It is the object of the invention to improve a projection objective that can be or is tuned to immersion operation with regard to its imaging properties or with regard to the correctability of image defects that are caused by a disturbance during immersion operation, such as a change in temperature, for example.

It is also the object of the invention to specify a method for correcting image defects of a projection objective that can be or is tuned to immersion operation, which can be carried out with the aid of simple means.

According to the invention, a lithography projection objective according to claim 1 is provided for achieving the first mentioned object.

According to the invention, a method for correcting aberrations in the case of a projection objective that can be, or is, tuned to immersion operation is specified according to claim 29 for the purpose of achieving the object mentioned in the second instance.

A lithography projection objective according to the invention for imaging a pattern to be arranged in an object plane of the projection objective onto a substrate to be arranged in an image plane of the projection objective has a multiplicity of optical elements that are arranged along an optical axis of the projection objective. The optical elements comprise a first group, following the object plane, of optical elements, and a last optical element, which follows the first group and is next to the image plane and which defines an exit surface of the projection objective and is arranged at a working distance from the image plane. The projection objective can be or is tuned with respect to aberrations for the case that the volume between the last optical element and the image plane is filled by an immersion medium with a refractive index substantially greater than 1. The position of the last optical element can be adjusted in the direction of the optical axis. A positioning device is provided that positions at least the last optical element during immersion operation such that aberrations induced by a disturbance caused by the operation of the projection objective are at least partially compensated.

The method according to the invention for correcting image defects in the case of a lithography projection objective that can be, or is, tuned to immersion operation comprises the step, in the event of a disturbance arising during immersion operation of the projection objective, of positioning at least the last optical element such that aberrations induced by the disturbance are at least partially compensated.

A disturbance in the case of the abovementioned projection objective or the abovementioned method is, for example, a change in temperature. The present invention is based on the finding that in the event of a change in temperature owing to heating up of the projection objective the working distance between the exit surface of the last optical element and the substrate is varied by the thermal expansion of the projection objective. However, since the immersion medium is located between the last optical element and the substrate during immersion operation, this change in the working distance leads to other sensitivities of the projection objective during immersion operation than by comparison with dry operation. In dry operation of the projection objective, the change in working distance has no influence on the aberrations, while the changed working distance, and thus the changed layer thickness of the immersion liquid during immersion operation, induces additional aberrations. These additional aberrations during immersion operation cannot be compensated solely by displacing the substrate in the direction of the optical axis, as in the case of the dry objective.

An instance of "disturbance" in the meaning of the present invention can also be one that is not caused by temperature, but is based, for example, on bubble formation in the immersion liquid, unevenness of the wafer surface, a locally differing wafer thickness or other geometry errors, and which renders refocusing necessary. This refocusing can be accomplished by displacing the wafer stage and/or displacing optical elements in the direction of the optical axis.

The inventive solution to this problem now consists, in the event of a disturbance, in positioning at least also the last optical element such that aberrations induced by the disturbance are at least partially compensated via the positioning of the last optical element. In particular, and preferably, by means of positioning of the last optical element the volume filled with the immersion medium, which can change in the event of disturbance such as a thermal expansion, can be set by means of the positioning device such that the aberrations induced by the disturbance, in particular aberrations of higher order, are at least largely compensated. By contrast with refocusing solely by adjusting the position of the substrate in the direction of the optical axis in the case of a projection objective during dry operation, now at least also the position of the last optical element is adjusted in the direction of the optical axis in order to keep the working distance, and thus the layer thickness of the immersion medium, preferably at a nominal value, while the gas-filled or air-filled space between the last optical element and the penultimate optical element of the projection objective is kept variable.

It is preferably also possible to adjust the position of the substrate in the direction of the optical axis, and the positioning device adjusts the last optical element in a ratio correlated with the adjustment of the position of the substrate. In particular, the ratio between the adjustment of the position of the substrate and the adjustment of the position of the last optical element can be selected to be 1:1.

With this type of "alternative focusing" in the immersion system by comparison with focussing in the dry system, the same focussing sensitivities are achieved in the immersion objective as in the case of focusing in the dry objective, in which only the substrate is displaced without adjusting the position of the last optical element in the direction of the optical axis.

Depending on requirement and degree of optimization, the ratio between the adjustment of the position of the substrate and the adjustment of the position of the last optical element can also be selected to be greater than or less than 1:1.

For the purpose of further optimizing the imaging properties of the projection objective during immersion operation, it is preferred in a first step to adjust only the position of the last optical element in the direction of the optical axis in order to restore a predetermined desired working distance, and in a second step the position of the last optical element and the position of the substrate are adjusted in the direction of the optical axis, preferably in the ratio of 1:1.

It is also possible here to interchange the first step and the second step in the sequence, or it can be provided to carry out these two steps in an interlocking fashion.

It has emerged that optimum corrections of the imaging properties, in particular even in higher orders of the spherical aberrations, that correspond to the achievable corrections in the dry configuration can be achieved by controlling the working distance filled with immersion medium to a nominal value that corresponds, for example, to the optimum value which is pre-calculated in the cold state of the projection objective, and the refocusing, as mentioned above, by simultaneously adjusting the position of the substrate and of the last optical element in the ratio of preferably 1:1.

The working distance is preferably measured before and/or during operation of the projection objective, in order to enable permanent control of the working distance. The respective measurement results are then used to adjust the position of the last optical element and/or of the substrate.

The measuring device preferably cooperates with an actuator in order to regulate the working distance to a nominal value. This enables unchanging optimum imaging properties of the projection objective during operation of the projection objective, that is to say the projection objective is capable of reacting to any sort of disturbance, for example changes in temperature, without manipulations from outside.

In a preferred alternative, it is also possible to proceed such that the position of the last optical element is adjusted so that aberrations can subsequently be at least largely compensated solely by adjusting the position of the substrate.

In this mode of procedure, the temperature sensitivities of the projection objective are therefore adapted during immersion operation such that, as in dry operation, they are again compatible with the sensitivities that exist from solely adjusting the substrate.

In the case of the projection objective, the last optical element is preferably assigned at least one actuator for adjusting the position of the last optical element in the direction of the optical axis.

Alternatively or cumulatively, the positioning device can have a mount for the last optical element that, upon heating up, moves the last optical element in a direction running counter to the thermal expansion of the projection objective.

This type of mounting technique for the last optical element with the use of materials with various coefficients of thermal expansion advantageously ensures that despite thermal expansion of the projection objective the working distance between the last optical element and the substrate can be kept at least approximately at the nominal value. This renders it possible even without additional actuators to compensate the aberrations induced by disturbance, or these are already avoided from the beginning.

In accordance with further preferred measures specified in the claims, the projection objective according to the invention can be tuned between dry operation and immersion operation.

Further advantages and features emerge from the following description and the attached drawing.

It is self-evident that the abovementioned features which are still to be explained below can be used not only in the combination respectively specified, but also in other combinations or on their own without departing from the scope of the present invention.

BRIEF DESCRIPTION OF THE DRAWINGS

Exemplary embodiments of the invention are illustrated in the drawing and explained in yet more detail here with reference thereto. In the drawing.

DETAILED DESCRIPTION OF PREFERRED EMBODIMENTS

Figure 1:
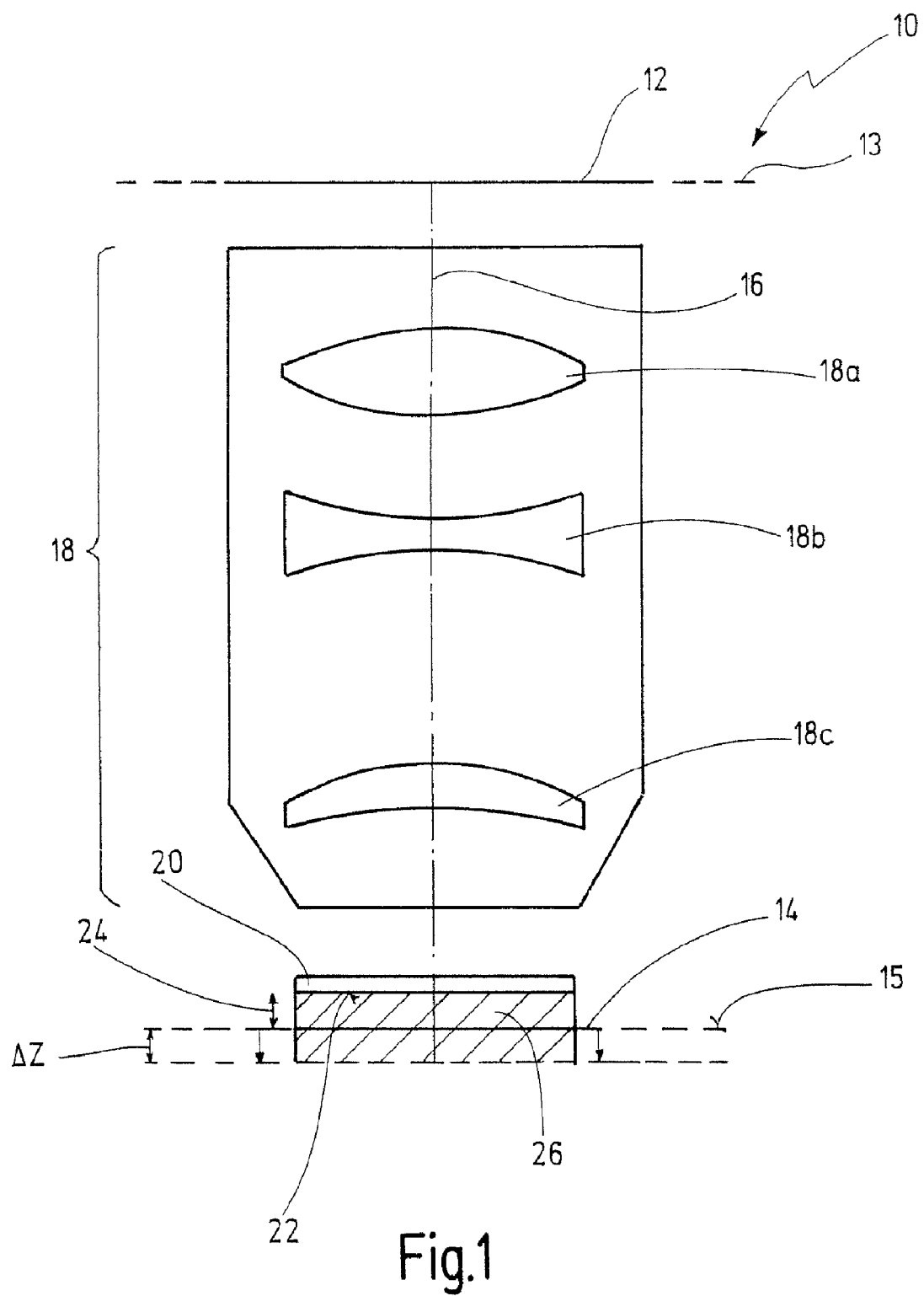
FIG. 1 shows a schematic projection objective in immersion configuration.

FIG. 1 illustrates a projection objective, provided with the general reference numeral 10, in immersion configuration.

The projection objective 10 is used for the microlithographic production of semiconductor components and other finely structured subassemblies. The projection objective operated with ultraviolet light from the deep UV region (for example 193 nm) serves to image onto a substrate 14, which is arranged in an image plane 15 of the projection objective 10, a pattern 12 of a photomask (reticle) that is arranged in an object plane 13 of the projection objective.

The projection objective 10 has a multiplicity of optical elements in the form of lenses, but can also have both lenses and mirrors.

The optical elements are arranged along an optical axis 16 of the projection objective 10.

The optical elements comprise a first group 18 of optical elements that follow the object plane 13 or the pattern 12.

Three optical elements 18a, 18b and 18c of the first group 18 are illustrated by way of example in FIG. 1.

The optical elements further comprise a last optical element 20 that follows the first group 18 and is closest to the substrate 14 or the image plane 15.

The last optical element 20 is illustrated in FIG. 1 as a plane-parallel plate. However, the last optical element 20 can also respectively have on the entrance side and exit side a radius of curvature that are, however, only so large that aspheric aberrations induced by the displacement of the optical element 20 in the direction of the optical axis 16 are sufficiently small.

Like the optical elements of the first group, the last optical element 20 can be made from synthetic quartz glass. Furthermore, the last optical element 20 can also comprise a number of components in the direction of the optical axis.

An exit surface 22, facing the image plane 15, of the last optical element 20 also simultaneously forms the exit surface of the projection objective 10.

A distance between the exit surface 22 of the last optical element 20 and the surface of the substrate 14 defines a working distance 24.

The last optical element 20 is spaced sufficiently far away, for example, by a few millimeters, from the first group 18 of optical elements, such that the position of the last optical element 20 can be adequately adjusted in the direction of the optical axis 16.

The working distance 24 between the last optical element 20 and the substrate 14 is filled with an immersion medium 26. The immersion medium 26 is, for example, an immersion liquid, for example water, that has a refractive index of n≈1.437 given an operating wavelength of λ=193 nm.

In the configuration illustrated in FIG. 1, the projection objective 10 is designed for immersion operation, that is to say, with reference to the aberrations produced, it is designed for, that is to say tuned to, the presence of the immersion medium 26 at the working distance 24.

Figure 2:
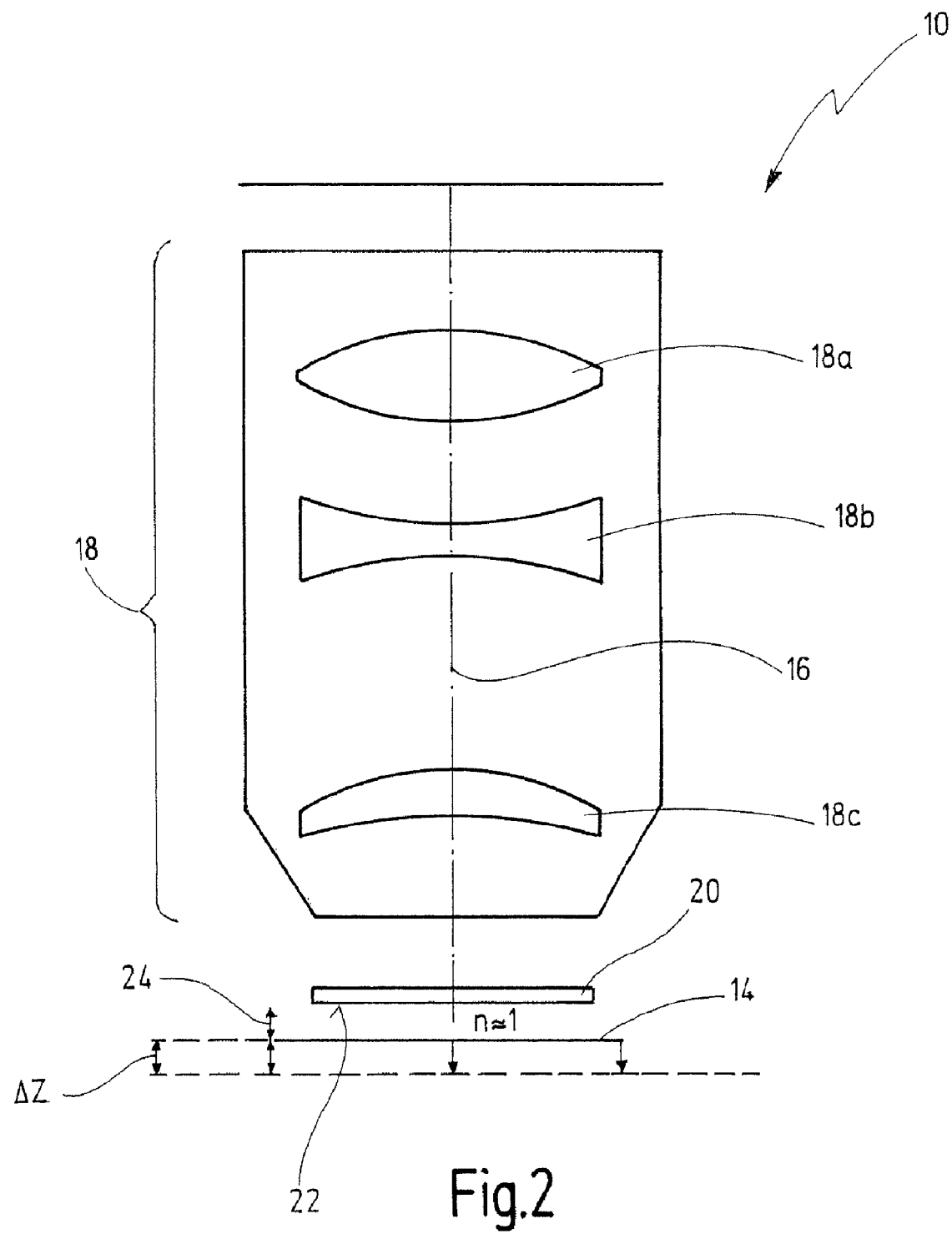
FIG. 2 shows the projection objective in FIG. 1 in dry configuration.

FIG. 2 shows the projection objective 10 in FIG. 1 in its dry configuration. The transition of the projection objective 10 in FIG. 1 (immersion configuration) to its dry configuration in FIG. 2 will firstly be described.

Starting with FIG. 1, the projection objective 10 is transformed as follows into its dry configuration. The immersion medium 26 is removed from the image space in a first step. This measure does not change the correction state before entry into the terminal element or into the last optical element 20 and at the exit of the terminal element 20. However, by removing the highly refractive, plane-parallel layer made from the immersion medium 26 from the image space, the overcorrecting effect thereof is taken away such that the correction state in the image plane 15 corresponds to the undercorrected correction state at the exit surface 22.

In a further step, the thickness of the last optical element 20 is enlarged. In this case, the overcorrecting effect thereof increases with the rising thickness. In accordance with the refractive index of the plate material, the thickness is selected to be so wide that the overcorrection effected by the thicker plate, which now forms the last optical element 20, largely compensates the undercorrected correction state at the entrance to the last optical element 20.

In two further steps, a larger working distance 24 by comparison with the immersion configuration in FIG. 1 is set by axially displacing the last optical element 20 in the direction of the first group 18. This can be performed by axially displacing the last optical element 20 with the aid of a z-manipulator that can be driven electrically or in another way. It is also possible to mount the last optical element 20 individually and to use spacers to set a suitable spacing between the mounts of the first group 18 and the mount of the last optical element 20 by removing and/or installing spacers. Since the plane-parallel plate 20 is as free from refractive power as possible and does not sag, this axial displacement can be carried out without this having a measurable influence on the aberrations of the projection objective 10.

Furthermore, at least one of the lenses, for example the negative lens 18b, in the first group 18 is mounted such that it can be displaced axially with the aid of a z-manipulator. A residual error can be compensated in this case by slightly displacing the lens 18b in the direction of the object plane such that the completely tuned projection objective 10 in dry configuration has a sufficiently good correction state at the light exit.

The last-mentioned step, specifically the fine tuning with the aid of at least one manipulatable or variable optical element of the first group 18 can frequently be required in order to be able to meet tight specifications. In the event of lesser requirements, the first-mentioned steps (changing the refractive index in the image space by introducing or removing an immersion medium, varying the thickness of the last element 20, and displacing the last element 20 in order to change the working distance 24) can suffice in order to achieve a reconfiguration between immersion configuration and dry configuration (or vice versa).

It is described below how a disturbance or interference in the form of a temperature change affects the projection objective 10 in dry configuration (FIG. 2), and how the same disturbance affects the projection objective 10 in immersion configuration (FIG. 1), and how aberrations induced by the disturbance can be corrected.

Firstly, the fact is that the response of the projection objective 10 to an identical disturbance in the dry configuration and in the immersion configuration is virtually identical if, firstly, the presence of the immersion medium 26 is discounted. Such disturbance is encountered with the projection objective 10 in the dry configuration by adjusting the position of the substrate 14 in the direction of the optical axis 16 in order thereby to carry out a focus correction such that the Zernike coefficient Z4 vanishes in the middle of the field.

A displacement of the substrate 14 in the direction of the optical axis 16 by the amount ΔZ (compare FIGS. 1 and 2) leads in both systems to a wavefront change OPD for which it holds that:

$$OPD_{\Delta z}(\rho) = \Delta z \cdot n \sqrt{1 - (NA/n)^2 \rho^2} . \quad (1)$$

Here, n is the refractive index at the working distance 24, that is to say n≈1.000 for air in the dry configuration, or n≈1.437 for water in the immersion configuration for a given wavelength λ=193 nm. ρ is the normalized radial pupil coordinate.

The wavefront change OPD Δz in accordance with equation (1) can be developed in the customary way using Zernike polynomials:

$$OPD_{\Delta z}(\rho) = \Delta z \cdot (f_4(NA,n) \cdot Z4(\rho) + f_9(NA,n) \cdot Z9(\rho) + f_{16}(NA,n) \cdot Z16(\rho) + f_{25}(NA,n) \cdot Z25(\rho) + f_{36}(NA,n) \cdot Z36(\rho)) \quad (2)$$

The following Zernike coefficients $\Delta z \cdot f_i$ (NA, n) with NA'=NA/n are then yielded analytically in this expansion:

$$f_4(NA, n) = n \cdot \frac{4 - NA'^2 - \sqrt{1 - NA'^2}(4 - 3NA'^2 - NA'^4)}{5/2 NA'^4} \quad (3)$$

$$f_9(NA, n) = n \cdot \frac{48 - 84NA'^2 + 35NA'^4 - \sqrt{1 - NA'^2}(48 - 60NA'^2 + 11NA'^4 + NA'^6)}{21/2 NA'^6} \quad (4)$$

$$f_{16}(NA, n) = \quad (5)$$
$$n \cdot \frac{320 - 720NA'^2 + 504NA'^4 - 105NA'^6 - \sqrt{1 - NA'^2}(320 - 560NA'^2 + 264NA'^4 - 23NA'^6 - NA'^8)}{45/2 NA'^8}$$

$$f_{25}(NA, n) = \quad (6)$$
$$n \cdot \frac{1792 - 4928NA'^2 + 4752NA'^4 - 1848NA'^6 + 231NA'^8}{77/2 NA'^{10}} -$$
$$n \cdot \sqrt{1 - NA'^2} \frac{\begin{pmatrix} 1792 - 4032NA'^2 + 2960NA'^4 - \\ 760NA'^6 + 39NA'^8 + NA'^{10} \end{pmatrix}}{77/2 NA'^{10}}$$

$$f_{36}(NA, n) = n \cdot \frac{9216 - 29952NA'^2 + 36608NA'^4 - 20592NA'^6 + 5148'^8 - 429NA'^{10}}{117/2 NA'^{12}} - \quad (7)$$
$$n \cdot \sqrt{1 - NA'^2} \frac{\begin{pmatrix} 9216 - 25344NA'^2 + 25088NA'^4 - \\ 10640NA'^6 + 1740NA'^8 - 59NA'^{10} - NA'^{12} \end{pmatrix}}{117/2 NA'^{12}}$$

It is to be seen from equations (3) to (7) that the Zernike coefficients $\Delta z \cdot f_i$, that is to say the induced spherical aberrations both of order Z4 and of higher orders Z9, Z16, Z25, Z36 are a function both of the numerical aperture and, in particular, of the refractive index n in the working distance 24.

Figure 3:
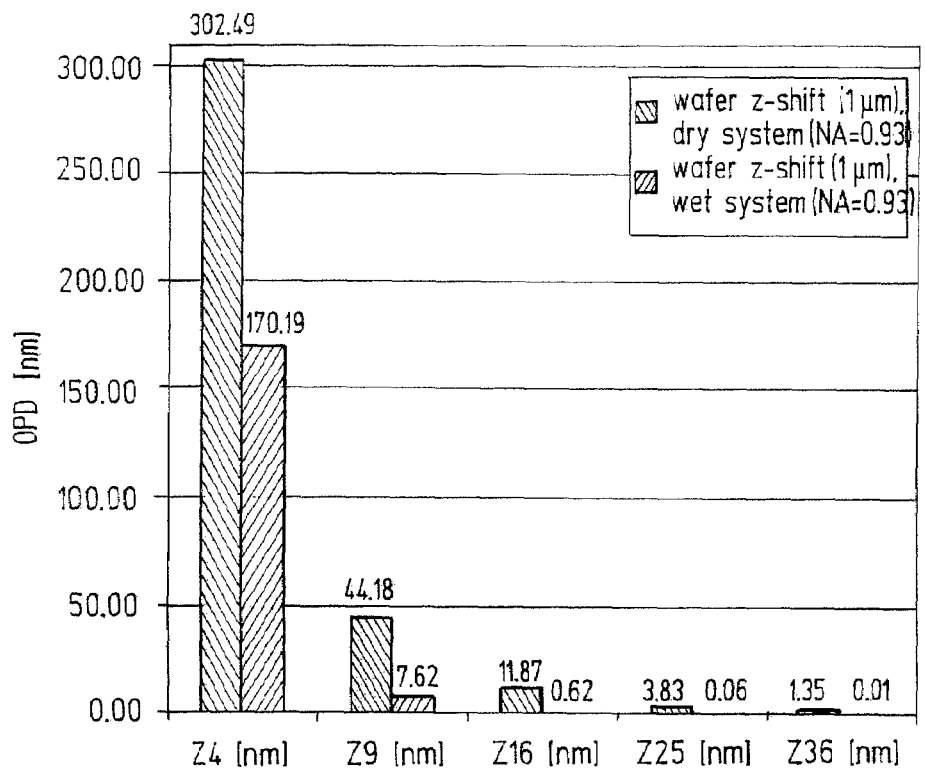
FIG. 3 shows a bar diagram for illustrating the influence of a displacement of the substrate in the direction of the optical axis on a wavefront change in a comparison between the projection objective in FIG. 2 (dry configuration) and the projection objective in FIG. 1 (immersion configuration)

FIG. 3 illustrates this state of affairs with reference to a numerical example. The bar diagram illustrates the wavefront changes, coded according to the Zernike coefficients Z4, Z9, Z16, Z25 and Z36 for a displacement of the substrate 14 by $\Delta z=1$ μm given a numerical aperture NA=0.93 for the projection objective in dry configuration (FIG. 2) and for the projection objective 10 in immersion configuration (FIG. 1). Of each pair of bars, the left-hand bar relates to the dry configuration, and the right-hand bar to the immersion configuration.

Figure 4:
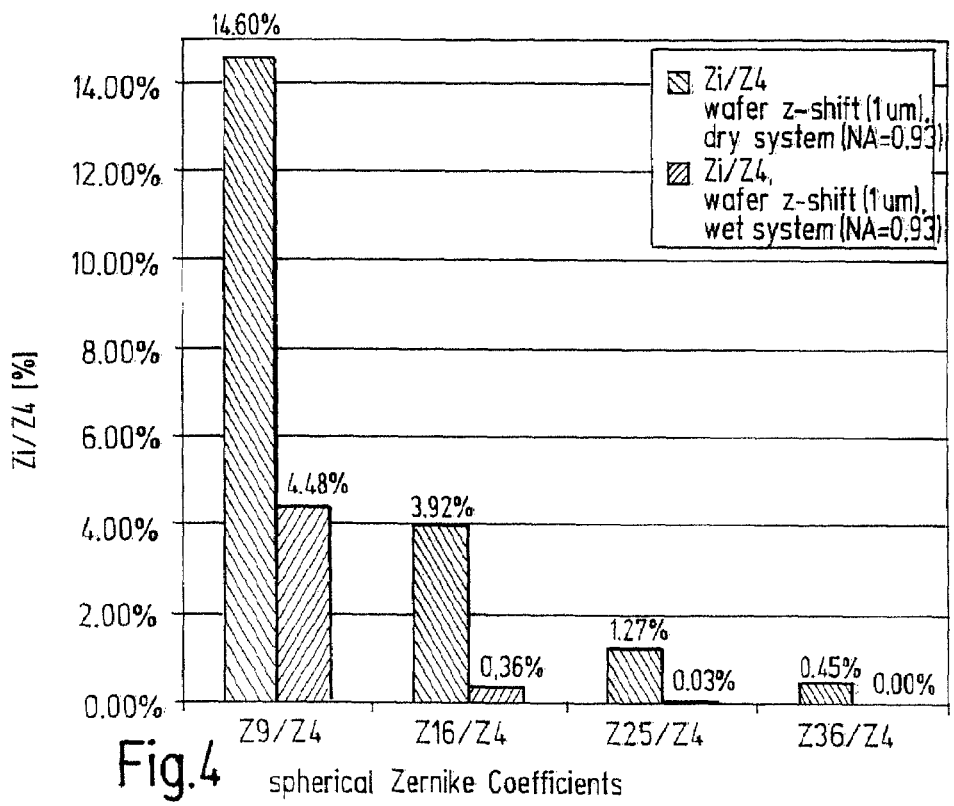
FIG. 4 shows a bar diagram in which the fractions of higher spherical aberrations (Z9, Z16, Z25, Z36) in relation to the Z4 fraction of the spherical aberration are illustrated by comparison with the projection objective in FIG. 2 and the projection objective in FIG. 1.

FIG. 4 illustrates the relative wavefront changes in the orders Z9, Z16, Z25 and Z36 referred to Z4. It follows in particular from FIG. 4 that a displacement of the substrate 14 in the direction of the optical axis 16 by the amount $\Delta z$ has a lesser effect on the wavefront changes in the higher orders Z9, Z16, Z25, Z36 with the projection objective 10 in immersion configuration than in the dry configuration. That is to say, the sensitivity of the projection objective 10 to the z-displacement of the substrate 14 in the higher Zernike coefficients is less in immersion configuration than in the dry configuration. The consequence of this is that the method of focus correction by displacing the substrate 14 in the direction of the optical axis 16 that is applied in the dry configuration of the projection objective 10 has less influence on the wavefront changes or aberrations of higher order.

While previously the different focus sensitivities of the projection objective 10 in the dry configuration have been considered by comparison with the immersion configuration, in the following the sensitivity of the projection objective 10 in both configurations is explained with regard to a disturbance in the form of a temperature change.

In a simulation of aberrations induced by a global, homogeneous temperature change, for example in the air (or another gas) around the projection objective 10, in the projection objective housing with the individual mounts, in the gas inside the projection objective 10, in the lenses and in the immersion liquid 24, the sensitivities of the following effects were considered:

1. Change in the lens geometries—that is to say the thicknesses and radii—through the thermal expansion of the lens material;
2. Changes in spacings through the thermal expansion of the projection objective housing (metal mounts):
   a. between the lenses ("air spaces"),
   b. between the pattern 12 (reticle) and a first optical element of the first group 18 of optical elements,
   c. between the last optical element 20 and the substrate 14;
3. Changes in refractive index $\Delta n = dn/dT \Delta T$ of the lens material (quartz, $CaF_2$);
4. Changes in refractive index $\Delta n = dn/dT \Delta T$
   a. of the gas between the individual optical elements of the first group 18,
   b. of the air (or the other gas) between the pattern 12 and the first optical element of the group 18,
   c. in the immersion liquid 24 between the last optical element 20 and the substrate 14 in the immersion system or in the air (or the other gas) in the case of the dry system.

Figure 5:
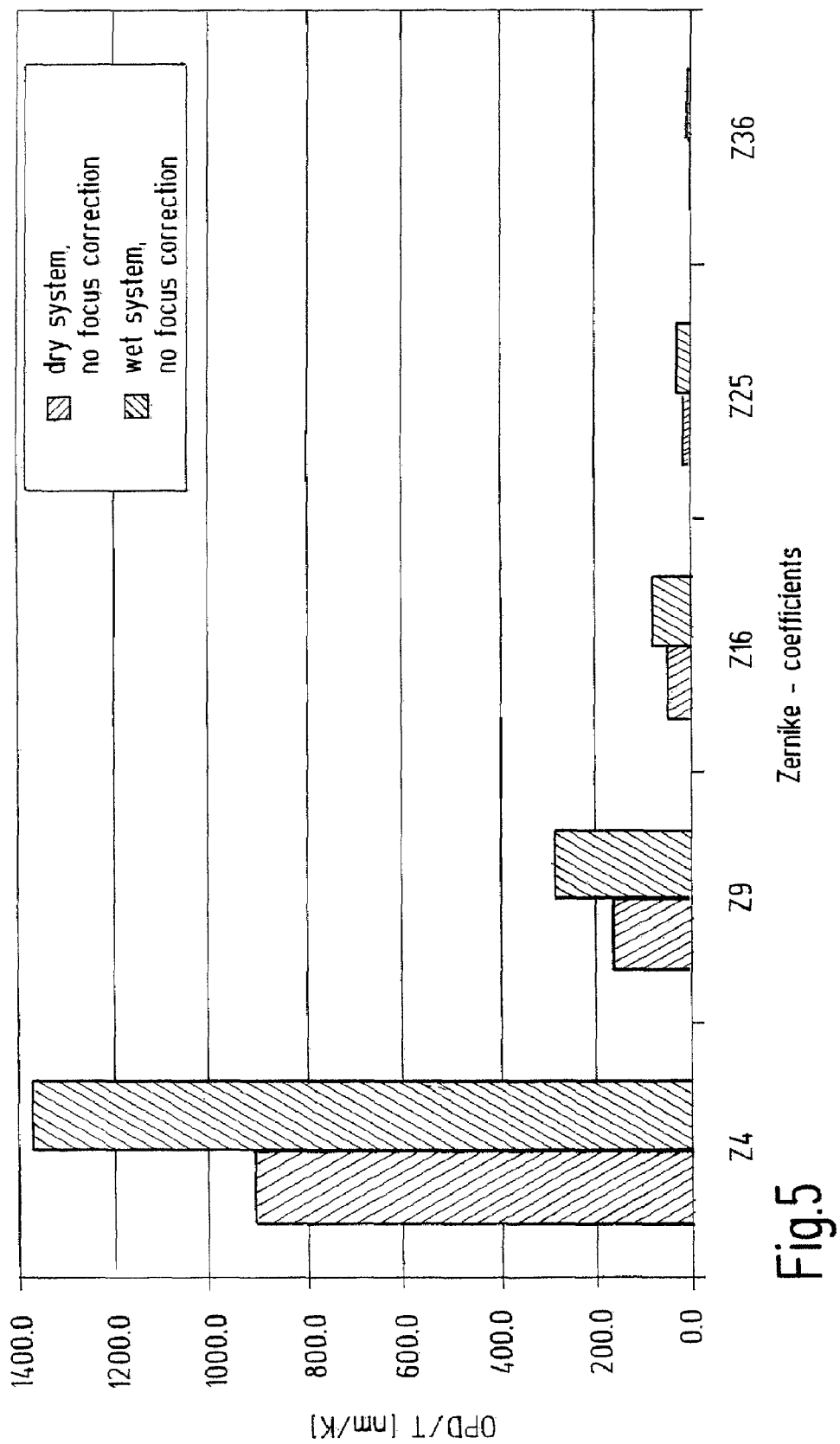
FIG. 5 shows a bar diagram that shows the temperature sensitivities of the projection objective in FIG. 2 in comparison with the temperature sensitivities of the projection objective in FIG. 1.

FIG. 5 shows the temperature sensitivities without focus correction, that is to say without displacement of the substrate 14 in the direction of the optical axis with reference to the spherical Zernike coefficients in the center of the field in a comparison between the projection objective 10 in the dry configuration and the projection objective 10 in the immersion configuration, once again the left-hand bar of each pair of bars referring to the dry configuration, and the right-hand bar referring to the immersion configuration.

It emerges from FIG. 5 that the dry configuration and the immersion configuration of the projection objective 10 differ considerably from one another with regard to the temperature sensitivities, at least in the orders Z4 and Z9. These differences between the dry configuration and the immersion configuration result from the above-mentioned contributions 2.c and 4.c to the temperature effects, that is to say the differences are a consequence of the presence of the immersion liquid 26 at the working distance 24 between the last optical element 20 and the substrate 14. Of the two contributions 2.c and 4.c, the contribution 2.c, that is to say the change in the working distance 24, is the dominating additional contribution to the aberrations in the immersion configuration. This can be explained in that the temperature-induced thermal expansion of the projection objective 10 displaces the last optical element 20 in the direction of the substrate 14. The working distance 24 is consequently reduced. Whereas this has no influence on the aberrations in the dry configuration, the change in the working distance 24 in the immersion configuration induces a changed layer thickness of the immersion liquid 26 that induces additional aberrations. All other above-mentioned contributions to the temperature effects yield virtually identical sensitivities in the two systems.

Figure 6:
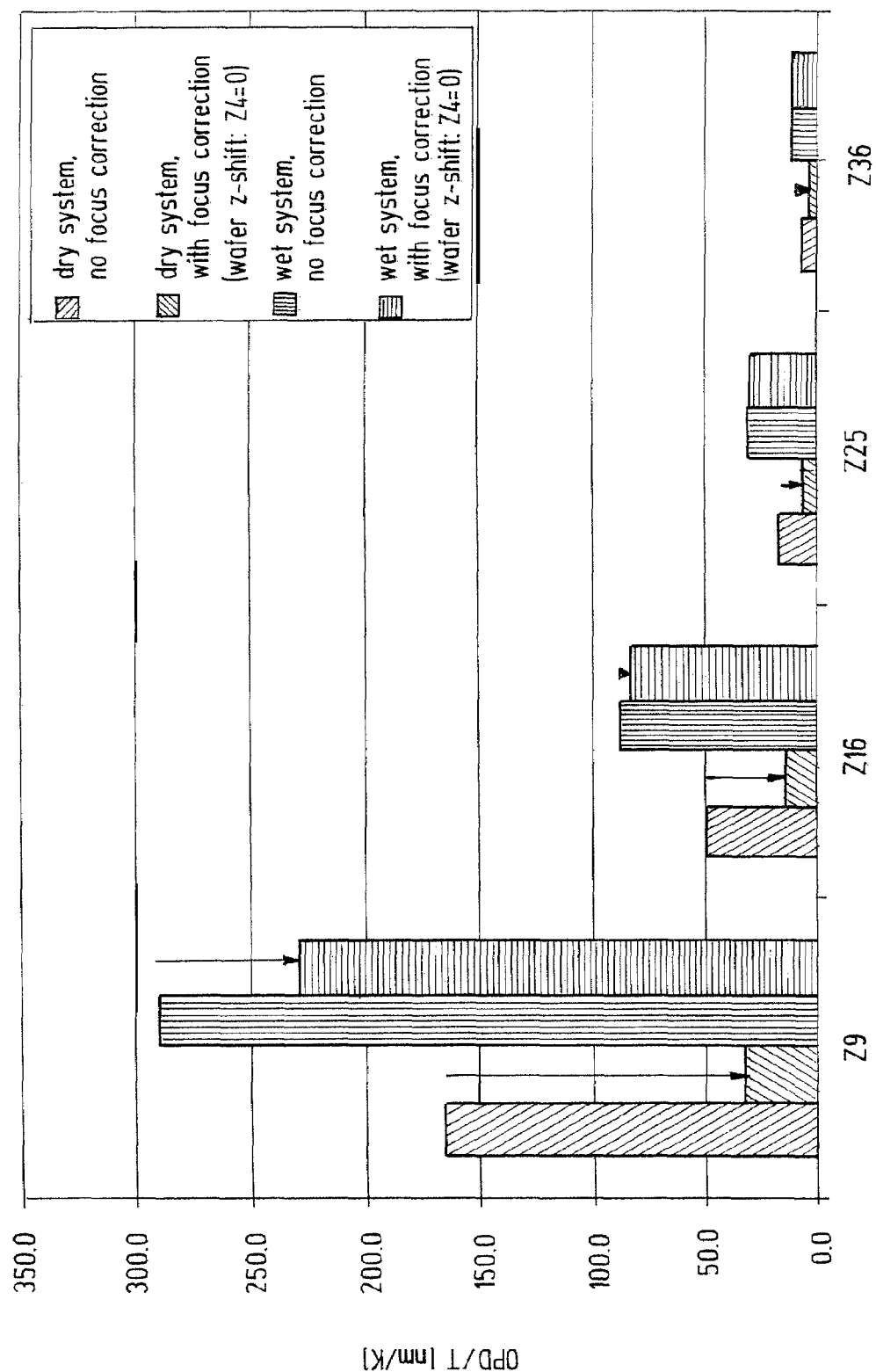
FIG. 6 shows a bar diagram that illustrates the temperature sensitivities of the projection objective in FIG. 2 in comparison with those of the projection objective in FIG. 1 with and without correction of the Z4 fraction of the spherical aberration to the value zero.

FIG. 6 illustrates with the aid of a further bar diagram the extent to which the previously described aberrations induced by a temperature change can be compensated only by adjusting the position of the substrate 14 in the direction of the optical axis 16.

FIG. 6 shows the wavefront changes OPD/T, caused by temperature changes, for the dry configuration and for the immersion configuration, respectively without and with focus correction solely by displacing the substrate 14 in the direction of the optical axis, in a fashion split up with reference to the Zernike coefficients Z9, Z16, Z25, Z36 (Z4=0 after the focus correction).

Of the four bars relating to each of the coefficients Z9, Z16, Z25, Z36, the first bar relates to the dry configuration without focus correction, the second bar to the dry system with focus correction (Z4=0), the third bar to the immersion configuration without focus correction, and the fourth bar to the immersion configuration with focus correction (Z4=0) solely by displacing the substrate 14 in the direction of the optical axis.

It is clear from FIG. 6 that in the dry configuration the higher spherical sensitivities Z9, Z16, Z25, Z36 relating to a homogeneous temperature change have a similar ratio to the Z4 fraction as the focus sensitivities in the case of adjusting the position of the substrate 14 in the direction of the optical axis 16. As a result of this circumstance, a focus correction, that is to say a correction such that Z4=0 in the middle of the field, solely by adjusting the position of the substrate 14 in the direction of the optical axis simultaneously also adequately corrects substantial contributions of the higher spherical aberrations Z9, Z16, Z25, Z36 in the dry configuration. By contrast, in the immersion configuration the crosstalk in the higher spherical Zernike coefficients is substantially smaller in the case of Z4 correction solely by adjusting the position of the substrate 14, as has been explained above with reference to FIGS. 3 and 4. The consequence of this is that in the case of a complete compensation of Z4 in the immersion configuration it is still only small fractions of the higher Zernike coefficients Z9, Z16, Z25, Z36 that are also compensated, and therefore large fractions of these aberrations of higher order remain as residual errors. Consequently, it is not sufficient to correct aberrations simply by adjusting the position of the substrate 14 in the direction of the optical axis, that is to say nothing but a focus correction to Z4=0 in the immersion configuration. This means that in the immersion configuration as contrasted with the dry configuration for the case of an identical temperature change there remains a residual error Z9 that is larger by a factor of approximately 7 and residual errors that are approximately four to five times larger for the other spherical Zernike coefficients of higher order when only one focus correction is performed by adjusting the position of the substrate 14.

Figure 7:
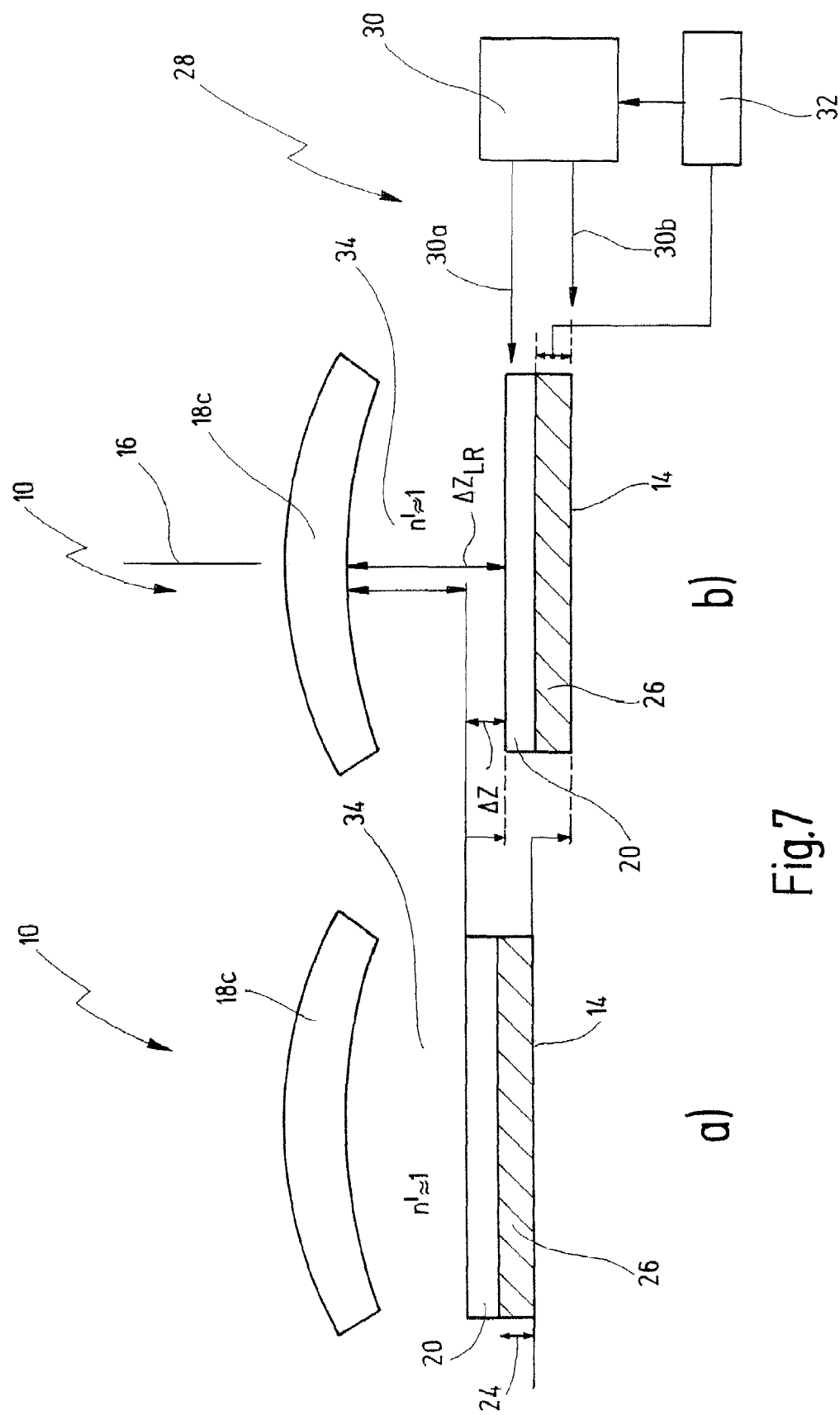
FIGS. 7a) and b) show a detail of the projection objective in FIG. 1 in two different states.

With reference to FIGS. 7a) and b), it is described below how the residual errors of the projection objective 10 can be reduced in immersion configuration by means of an alternative type of focusing.

FIG. 7a) shows the projection objective 10 in accordance with FIG. 1 in the region of the last optical element 20 and of the penultimate optical element 18c that forms the last optical element of the first group 18 of optical elements of the projection objective 10. The space between the penultimate optical element 18c and the last optical element 20 is filled with a gas having a refractive index n of approximately 1.

In accordance with FIG. 7b), the projection objective 10 has a positioning device 28 that comprises an actuator 30 and a measuring device 32. The actuator 30 is capable of positioning the last optical element 20 in the direction of the optical axis 16 (z direction) as is indicated by an arrow 30a. The actuator 30 is further capable of likewise positioning the substrate 14 in the direction of the optical axis 16, as indicated by an arrow 30b.

The actuator 30 is capable, in particular, of adjusting the position of the last optical element 20 and of the substrate 14 in a mutually correlated ratio in the direction of the optical axis 16.

The aim firstly is to discuss what is the result of a common adjustment of the position of the last optical element 20 and of the substrate 14 in the same direction in a ratio of 1:1 as is illustrated in FIG. 7b) by comparison with FIG. 7a).

Adjusting the position of the last optical element 20 enlarges the air space 34 between the penultimate optical element 18c and the last optical element 20 by the amount $\Delta z_{LR}$ when the optical element 20 is displaced by the amount $\Delta z$ (just like the substrate 14).

The wavefront change $OPD_{\Delta z,LR}$ owing to the enlargement of the air space 34 is then given by $$OPD_{\Delta z,LR}(\rho) = \Delta z \cdot n' \sqrt{1-(NA/n')^2 \rho^2} \qquad (8)$$

Here, n' is the refractive index of the gas in the air space 34 upstream of the last optical element 20. Comparing equation (8) with equation (1) shows that this type of focusing in the projection objective 10 in immersion configuration leads to the same change in the wavefront as does a corresponding sole displacement of the substrate 14 in the dry configuration, since the refractive index n'~1 in the last air space 34 upstream of the last optical element 20 is virtually identical to the refractive index n~1 of the air in the dry system. Consequently, the projection objective 10 in the dry configuration and in the immersion configuration then have the same focus sensitivities (equations (2) to (7)) with the same crosstalk to the higher spherical Zernike coefficients Z9, Z16, Z25, Z36.

Figure 8:
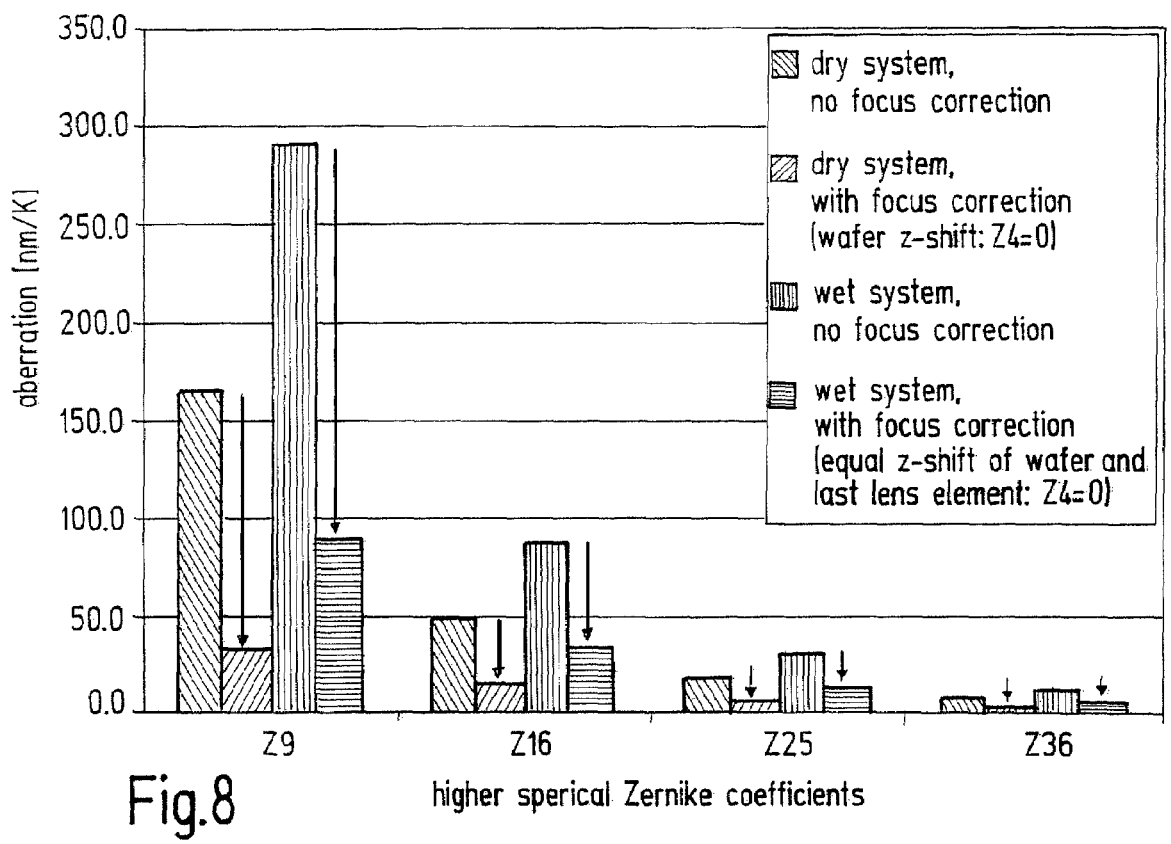
FIG. 8 shows a bar diagram similar to FIG. 6 although aberrations of higher order are illustrated after an identical displacement of the last optical element and the substrate for the projection objective in FIG. 1 in accordance with FIG. 7b) (the ratio between the adjustment of the position of the substrate and the adjustment of the position of the last optical element being equal to 1:1)

FIG. 8 shows a similar illustration to that in FIG. 6, the fourth bar in relation to each of the Zernike coefficients Z9, Z16, Z25, Z36 showing the residual aberrations for the projection objective 10 in immersion configuration after an identical displacement of the last optical element 20 and of the substrate 14.

Comparing this respective fourth bar with the respective fourth bar in FIG. 6 shows that the residual aberrations in the higher Zernike coefficients Z9, Z16, Z25, Z36 are substantially reduced, and differ from the residual aberrations in the dry configuration only by factors of approximately 1.7 to 2.7.

It is described below how the residual aberrations of the projection objective 10 in the immersion configuration can be yet further reduced.

A further reduction in the residual aberrations of the projection objective 10 in immersion configuration is achieved by setting the working distance 24 between the last optical element 20 and the substrate 14 solely by adjusting the position of the last optical element 20 to a nominal value (nominal working distance), something which can likewise be carried out with the aid of the actuator 30. The nominal value can in this case be the originally set optimum working distance in immersion configuration if no disturbance such as a temperature-induced expansion of the system is present.

The wavefront change $OPD_{\Delta z,LLE}$ owing to displacement of the last optical element 20 by the path $\Delta z$ in the direction of the optical axis is then yielded as the difference between the wavefront change $OPD_{\Delta z,LR}$ by enlarging the last air space 34 (FIG. 7b)) and the wavefront change $OPD_{\Delta z,S}$ by adjusting the position of the substrate 14 in the direction of the optical axis 16:

$$OPD_{\Delta z,LLE}(\rho) = OPD_{\Delta z,LR}(\rho) - OPD_{\Delta z,S}(\rho) \qquad (9)$$

$$= \Delta z \left[ n' \sqrt{1-(NA/n')^2 \rho^2} - n\sqrt{1-(NA/n')^2 \rho^2} \right]$$

Here, n is the refractive index of the immersion medium 26, and n' is the refractive index of the gas in the air space 34 upstream of the last optical element 20.

The (sole) adjustment of the position of the last optical element 20 can now be used to fully compensate again the displacement of the last optical element 20 in the direction of the substrate 14 induced by the thermal expansion of the projection objective 10.

Figure 9:
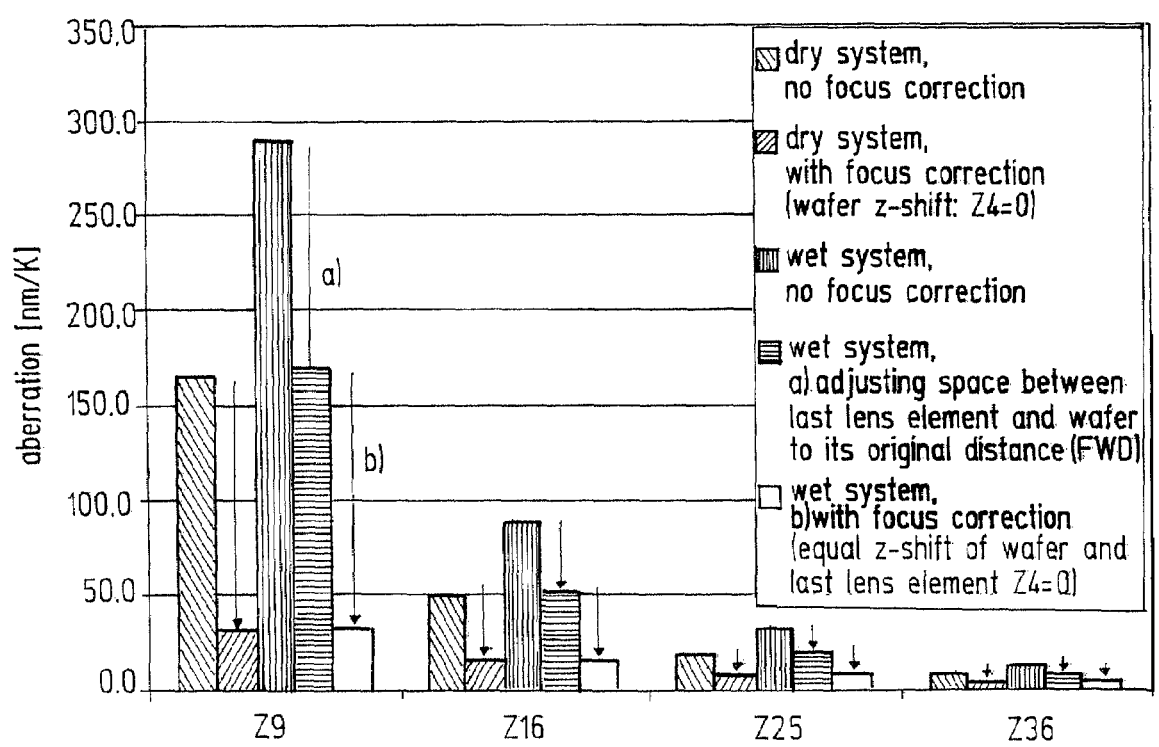
FIG. 9 shows a bar diagram, comparable to the bar diagram in FIG. 8, after a further error correction of the projection objective in FIG. 1 (the ratio between the adjustment of the position of the substrate and the adjustment of the position of the last optical element not being equal to 1:1)

The result of this mode of procedure is illustrated in FIG. 9.

FIG. 9 shows for the first bar (seen from the left) relating to each Zernike coefficient Z9, Z16, Z25, Z36 the aberrations of a projection objective 10 in dry configuration due to a disturbance in the form of a temperature change, no focus correction yet having been performed. (The Zernike coefficient Z4, which is not shown in this figure, does not vanish here.)

The respective second bar in FIG. 9 shows the residual aberrations of the projection objective 10 in dry configuration after a focus correction solely by displacing the substrate 14 in the direction of the optical axis 16. (The Zernike coefficient Z4, which is not shown in this figure, vanishes here.)

The respective third bar in FIG. 9 shows in relation to each Zernike coefficient Z9, Z16, Z25, Z36 the aberrations of the projection objective 10 in immersion configuration due to a disturbance in the form of a temperature change without focus correction, the fourth bar shows the aberrations after setting the working distance 24 between the last optical element 20 and the substrate 14 to a desired working distance that corresponds, or can correspond, to the originally set working distance before commissioning of the projection objective 10, and the fifth bars show the residual aberrations after additional common adjustment of the position of the last optical element 20 and of the substrate 14 in the direction of the optical axis in the ratio of 1:1.

Comparing the first and fourth bars relating to each Zernike coefficient in FIG. 9 reveals that restoring the desired working distance between the last optical element 20 and the substrate 14 yields sensitivities that are virtually identical to the not refocused sensitivities of the projection objective 10 in dry configuration.

Comparing the second and fifth bars in relation to each Zernike coefficient in FIG. 9 reveals that these show identical residual aberrations for the projection objective 10 in dry configuration after focus correction, and identical residual aberrations for the projection objective 10 in immersion configuration after adjusting the position of the last optical element 20 in order to set a desired working distance, and identical adjustment of the position of the last optical element 20 and of the substrate 14 in the direction of the optical axis 16.

The focus correction (Z4=0) is carried out by correlated adjustment of the position of the last optical element 20 and the substrate 14. This now results in the same corrective action as in the case of the projection objective 10 in dry configuration (identical focus sensitivities), and virtually identical and sufficiently small residual errors of the higher spherical aberrations are achieved.

During operation of the projection objective 10 in immersion configuration, the working distance 24 can be controlled by means of the measuring device 32, and it is then possible on the basis of the respective measurement results to use the actuator 30 to keep the working distance 24 at the desired working distance, in the manner of a control loop.

Figure 10:
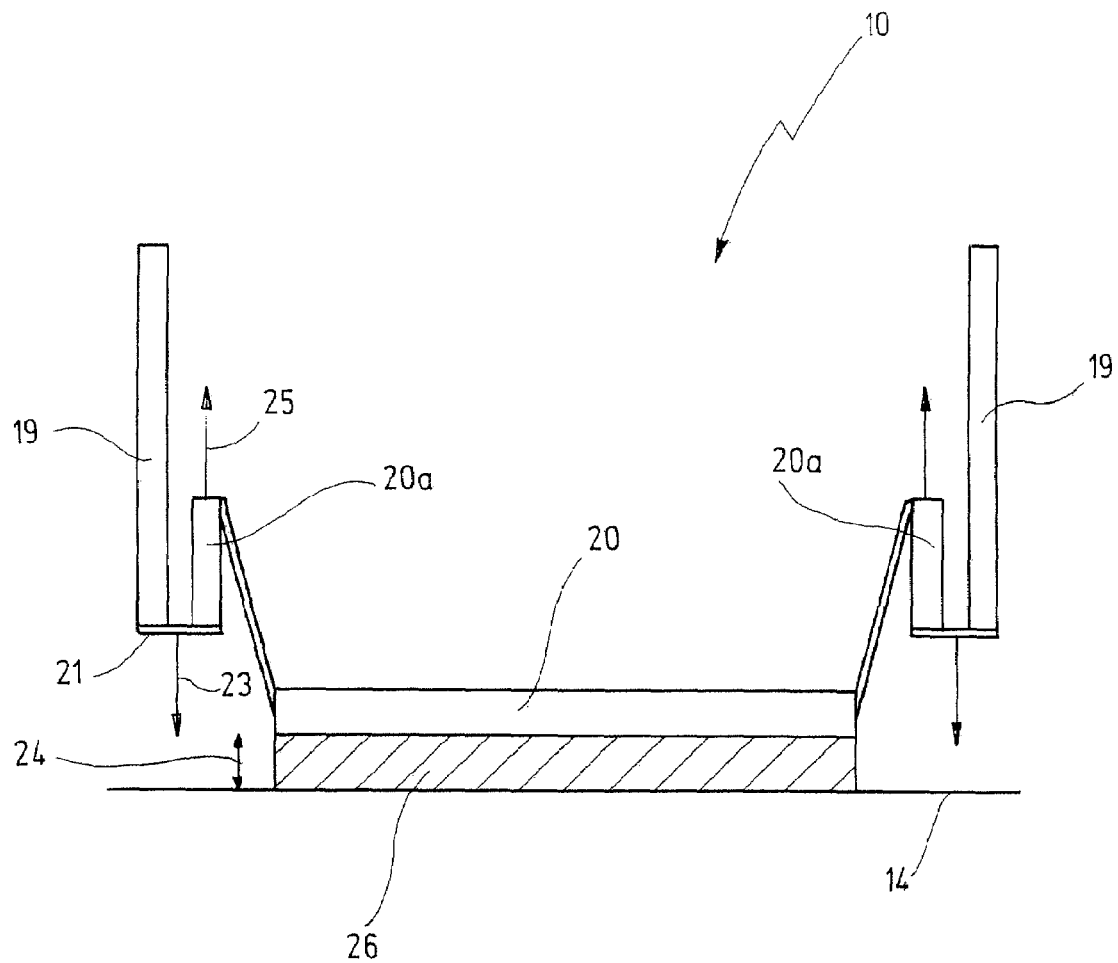
FIG. 10 shows a schematic of a mount for the last optical element that compensates or overcompensates a temperature-induced change in the working distance.

FIG. 10 illustrates diagrammatically an embodiment with the aid of which, on the basis of a specific mounting technique for the last optical element 20, it is already possible to keep the working distance 24 between the last optical element 20 and the substrate 14 with reference to temperature changes at the set point, or to position the last optical element 20 for the purpose of minimizing aberrations.

The last optical element 20 is held in a mount 20a that is connected to a mount 19 of an optical element of the first group 18 of optical elements of the projection objective 10 at a point 21. The mount 20a has, in particular, a thermal expansion coefficient that is large by comparison with the thermal expansion coefficient of the mount 19.

If, by heating up, the mount 19 now expands in the direction of an arrow 23, this would reduce the working distance 24. However, owing to the heating up the mount 20a also expands, but in the opposite sense to the expansion of the mount 19 in accordance with an arrow 25, the result being not to diminish the working distance 24 but to keep it substantially constant. It is thereby possible to keep the working distance 24 at the nominal value.

However, it is also possible to provide not to keep the working distance 24 at the nominal value by means of the previously described mounting technique, but to fashion the mount 20a for the last optical element 20 such that it not only compensates the change in the working distance 24, but overcompensates it in such a way that the above-described customary focus correction, that is to say solely adjusting the position of the substrate 14, leads again to the same results for the correction of aberrations. Thus, with this mode of procedure the temperature sensitivities of the projection objective are adapted in terms of design in such a way that they are once again compatible with the focus sensitivities as in the dry configuration.

The following measures are provided with reference, again, to FIGS. 1 and 2, which show the projection objective 10 in immersion configuration and in dry configuration, respectively, in order to tune the projection objective 10 between the dry configuration and the immersion configuration.

A large distance that enables a substantial axial displacement of the last optical element 20 exists between the first group 18 and the last optical element 20.

The tunability between the immersion configuration in FIG. 1 and the dry configuration in FIG. 2 of the projection objective 10 is preferably achieved with the aid of a variation in the thickness of the last optical element 20, preferably in conjunction with a displacement of the last optical element 20 relative to the image plane 15, it being necessary, however, not to confuse this method with the previously described method for correcting aberrations of the projection objective 10 in the immersion configuration.

The last optical element 20 is, furthermore, exchangeable.

The last optical element 20 can have a variable thickness, the last optical element 20 preferably having a thickness that can be varied without removing material or adding material. This is preferably achieved by virtue of the fact that the last optical element 20 comprises a number of mutually detachable components that are arranged at a spacing from one another or are neutrally interconnected in optical terms, it being preferred for components of the last optical element 20 to consist of different optical materials, preferably at least one component consisting of fluoride crystal, in particular of lithium fluoride or calcium fluoride.

The optical material, adjacent to the exit surface 22, of the last optical element 20 preferably has a refractive index $n_E$ that is close to the refractive index $n_I$ of the immersion medium 26, it being preferred for a ratio $n_I/n_E$ to be more than 0.8, in particular more than 0.9.

Furthermore, the first group 18 of optical elements also has at least one displaceable optical element, but preferably a number of, in particular at least five, displaceable optical elements, at least one of the displaceable optical elements being displaceable along the optical axis 16.

A free space upstream of the previously mentioned displaceable element and/or downstream of the displaceable element is in this case preferably dimensioned to be so large that displacing the at least one displaceable optical element renders it possible to correct at least a fraction of aberrations that result from adapting the last optical element 20 to the immersion medium 26. The projection objective 10 can be assigned at least one exchangeable optical correction element that preferably has at least one aspheric surface. Furthermore, at least one optical element of the first group 18 can have at least one optical surface with a surface curvature that can be varied reversibly or permanently.

The projection objective 10 is designed such that, when use is made of the immersion medium 26, that is to say in the immersion configuration, it has an image-side numerical aperture NA<1 between exit surface 22 and image plane 15, the image-side numerical aperture preferably being between approximately 0.7 and 1.0, in particular between 0.8 and 1.0.

It is further provided that the last optical element 20 can be removed from the projection objective 10 and be replaced by a plane-parallel plate that is large by comparison with the exit surface of the projection objective 10 and can be laid over a large area of the substrate 14 to be exposed.

Figure 11:
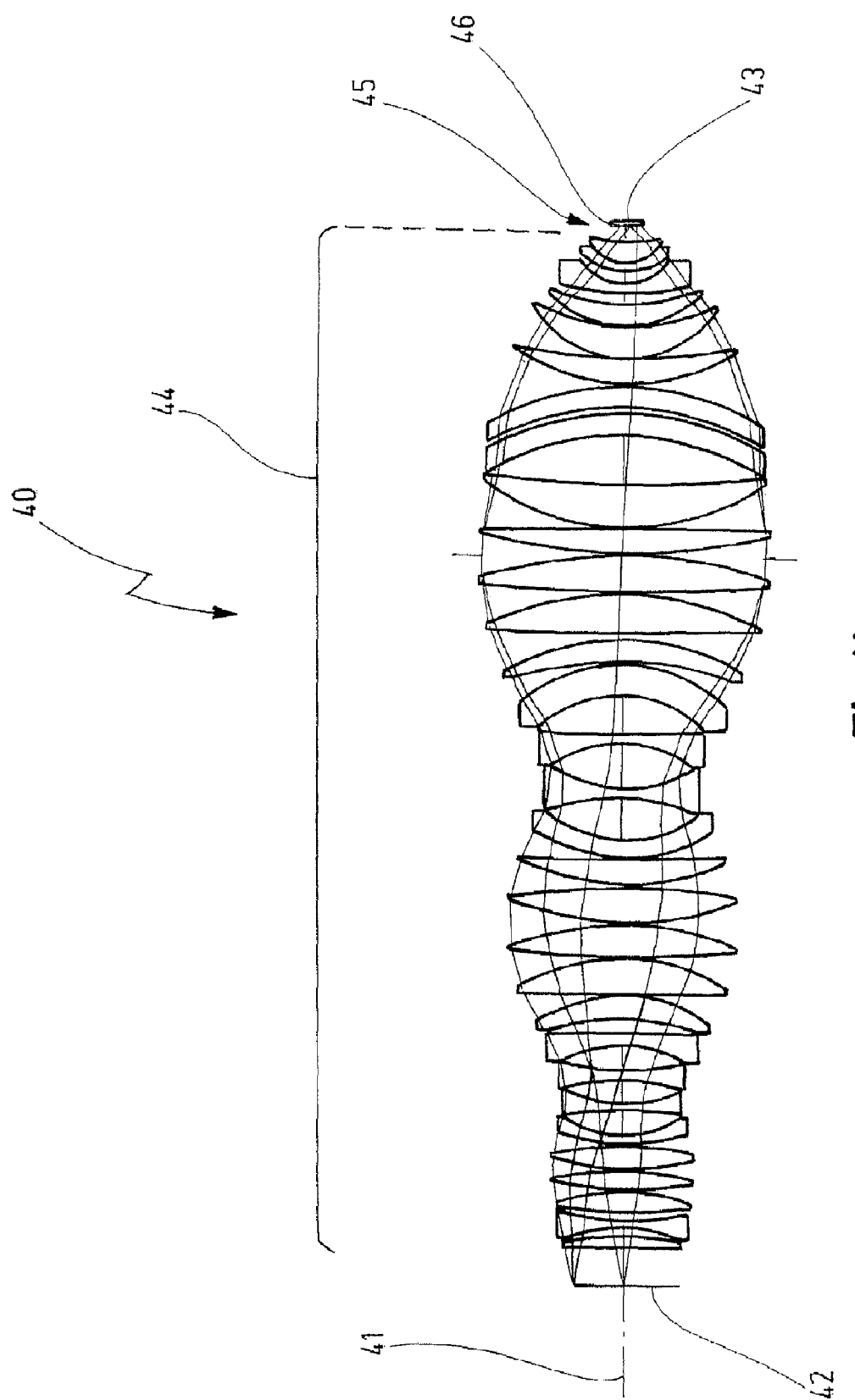
FIG. 11 shows an embodiment of a projection objective in immersion configuration, in which the present invention can be used.
Figure 12:
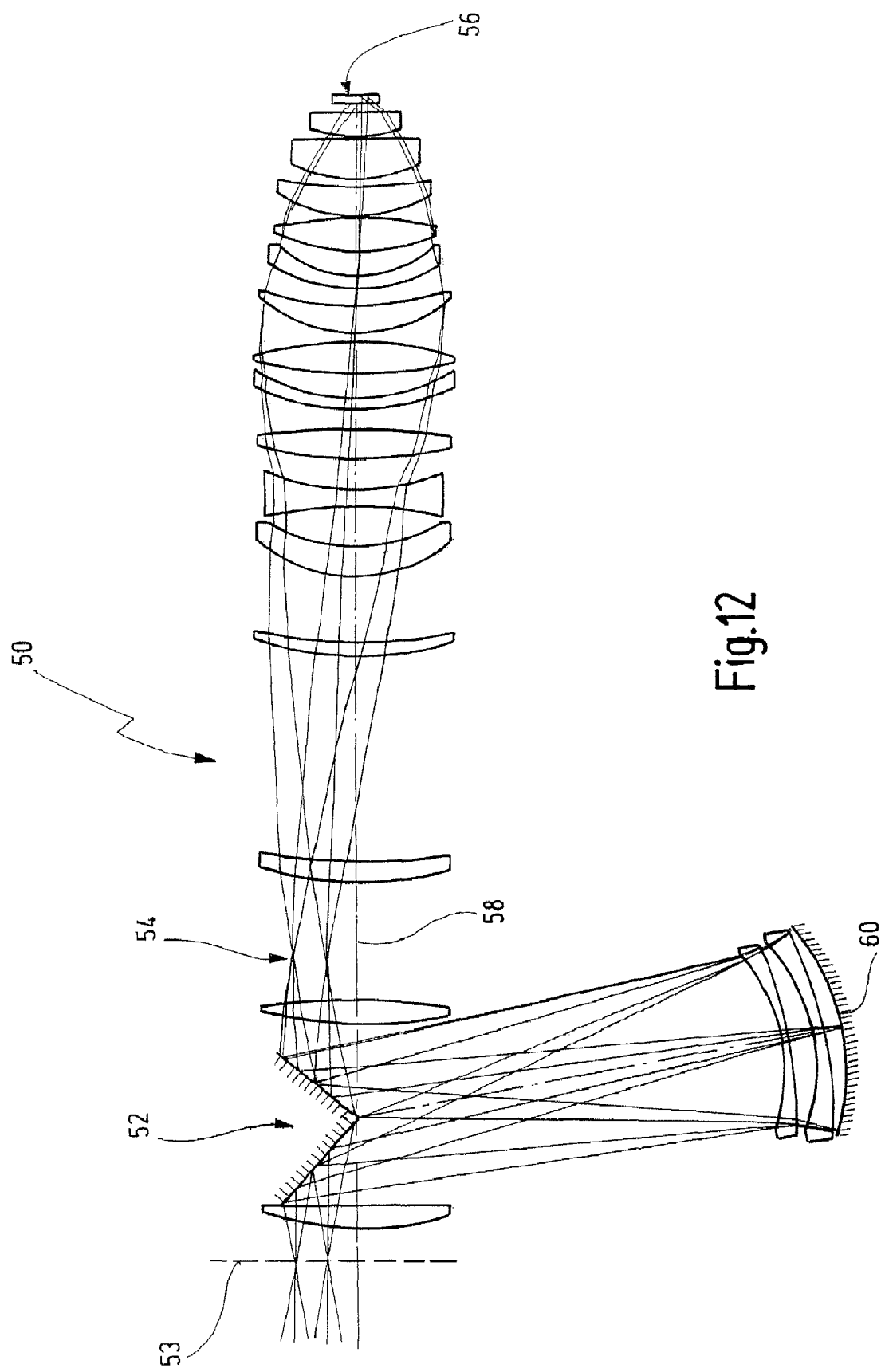
FIG. 12 shows a further embodiment of a projection objective in immersion configuration in which the present invention can likewise be implemented.

FIGS. 11 and 12 demonstrate particular exemplary embodiments of projection objectives in the case of which the present invention can be implemented.

FIG. 11 shows by way of example a purely refractive, rotationally symmetrical projection objective 40 for high-resolution microlithography, in particular in the DUV wavelength region. In FIG. 11, 41 designates the optical axis of the projection objective 40, 42 denotes the object plane, 43 denotes the image plane, 44 denotes the first group of optical elements, 45 denotes the last optical element, and 46 denotes the immersion medium. Table 1 (appended) summarizes the specification of the design of the projection objective 40 in tabular form. In this case, column 1 specifies the number of refractive surfaces or surfaces otherwise distinguished, column 2 specifies the radius of the surfaces (in mm), column 3 specifies the distance, designated as thickness, of the surface from the subsequent surface (in mm), column 4 specifies the material, column 5 specifies the refractive index of the material at the operating wavelength, and column 6 specifies the maximum useful radius (half the free diameter). The total length L between the object plane and image plane is approximately 1.166 mm. All curvatures are spherical. FIG. 11 shows the projection objective 40 in immersion configuration, and the data in table 1 likewise correspond to the immersion configuration. Table 2 contains the data of the projection objective in dry configuration.

FIG. 12 illustrates a catadioptric projection objective 50 in the case of which the present invention can likewise be used. The catadioptric projection objective 50 with geometric beam splitter 52 is provided for the purpose of imaging a pattern lying in its object plane 53 into the image plane 56 to the scale 4:1 while producing a real intermediate image 54 in the image plane 56. The optical axis 58 is folded at the geometric beam splitter 52 in order to be able to make use when imaging of a concave mirror 60 that facilitates the chromatic correction of the overall system. FIG. 12 and table 3 reproduce the properties of the projection objective 50 in the immersion configuration. Table 4 contains the data of the corresponding dry configuration.

The data of the projection objective 50 are listed in table 5, the surface 32 being formed by a nanosphere.

TABLE 1 j29o

| SURFACE | RADII | THICKNESSES | LENSES | REFRACTIVE INDEX 248.38 nm | ½ FREE DIAMETER |
|---|---|---|---|---|---|
| 0 | 0.000000000 | 32.000000000 |  | 1.00000000 | 54.410 |
| 1 | 0.000000000 | 10.587540450 | L710 | 0.99998200 | 61.093 |
| 2 | −2417.351767120 | 13.126300000 | SUPRA1 | 1.50833811 | 63.132 |
| 3 | −248.195466920 | 7.359264018 | L710 | 0.99998200 | 63.945 |
| 4 | −168.131361870 | 10.000000000 | SUPRA1 | 1.50833811 | 64.202 |
| 5 | 328.986124739 | 7.907519166 | L710 | 0.99998200 | 70.046 |
| 6 | 671.742152743 | 22.614900000 | SUPRA1 | 1.50833811 | 71.945 |
| 7 | −219.346865952 | 1.054978296 | L710 | 0.99998200 | 73.402 |
| 8 | 351.854459479 | 21.378800000 | SUPRA1 | 1.50833811 | 77.449 |
| 9 | −417.329819985 | 0.748356148 | L710 | 0.99998200 | 77.686 |
| 10 | 266.259242017 | 26.426700000 | SUPRA1 | 1.50833811 | 76.971 |
| 11 | −418.068287643 | 0.747164753 | L710 | 0.99998200 | 75.964 |
| 12 | 195.049526899 | 10.000000000 | SUPRA1 | 1.50833811 | 69.816 |
| 13 | 112.784218098 | 27.264697553 | L710 | 0.99998200 | 64.221 |
| 14 | −548.976305020 | 10.000000000 | SUPRA1 | 1.50833811 | 63.660 |
| 15 | 167.581609987 | 25.042515270 | L710 | 0.99998200 | 61.992 |
| 16 | −203.629259785 | 10.000000000 | SUPRA1 | 1.50333811 | 62.349 |
| 17 | 360.120642869 | 28.995838980 | L710 | 0.99998200 | 86.965 |
| 18 | −127.653905514 | 12.696400000 | SUPRA1 | 1.50833811 | 88.153 |
| 19 | −1103.725724970 | 17.018787360 | L710 | 0.99998200 | 81.984 |
| 20 | −225.898831342 | 23.521200000 | SUPRA1 | 1.50833811 | 84.684 |
| 21 | −171.063497139 | 1.574450554 | L710 | 0.99998200 | 92.606 |
| 22 | −22770.163604600 | 38.438000000 | SUPRA1 | 1.50833811 | 109.997 |
| 23 | −229.816390281 | 0.749282985 | L710 | 0.99998200 | 113.270 |
| 24 | 1170.594630540 | 38.363100000 | SUPRA1 | 1.50833811 | 123.579 |
| 25 | −320.184892150 | 0.749629640 | L710 | 0.99998200 | 124.514 |
| 26 | 335.012872058 | 39.596800000 | SUPRA1 | 1.50833811 | 124.658 |
| 27 | −764.462984962 | 2.214257730 | L710 | 0.99998200 | 123.947 |
| 23 | 270.136227728 | 25.935800000 | SUPRA1 | 1.50833811 | 112.963 |
| 29 | 1248.618077510 | 4.352014987 | L710 | 0.99998200 | 110.825 |
| 30 | 177.098661261 | 18.578800000 | SUPRA1 | 1.50833811 | 96.632 |
| 31 | 131.459110961 | 48.405871098 | L710 | 0.99998200 | 84.997 |
| 32 | −254.431714105 | 10.000000000 | SUPRA1 | 1.50833811 | 83.694 |
| 33 | 149.734192113 | 49.515509852 | L710 | 0.99998200 | 77.858 |

TABLE 1-continued j29o

| SURFACE | RADII | THICKNESSES | LENSES | REFRACTIVE INDEX 248.38 nm | ½ FREE DIAMETER |
|---|---|---|---|---|---|
| 34 | −137.204786283 | 10.000000000 | SUPRA1 | 1.50833811 | 78.232 |
| 35 | 1410.223675540 | 43.391488727 | L710 | 0.99998200 | 89.345 |
| 36 | −134.825941720 | 35.292100000 | SUPRA1 | 1.50833811 | 91.736 |
| 37 | −188.413502871 | 3.480235112 | L710 | 0.99998200 | 110.924 |
| 38 | −350.805989269 | 24.010800000 | SUPRA1 | 1.50833811 | 123.372 |
| 39 | −244.301424027 | 6.015284795 | L710 | 0.99998200 | 128.258 |
| 40 | 4941.534628580 | 43.549100000 | SUPRA1 | 1.50833811 | 147.192 |
| 41 | −357.889527255 | 2.367042190 | L710 | 0.99998200 | 149.417 |
| 42 | 1857.663670230 | 40.932000000 | SUPRA1 | 1.50833811 | 156.043 |
| 43 | −507.091567715 | −0.213252954 | L710 | 0.99998200 | 156.763 |
| 44 | 0.000000000 | 0.962846248 | L710 | 0.99998200 | 155.516 |
| 45 | 637.188120359 | 28.431900000 | SUPRA1 | 1.50833811 | 156.869 |
| 46 | −4285.746531360 | 0.749578310 | L710 | 0.99998200 | 156.617 |
| 47 | 265.928249908 | 45.432900000 | SUPRA1 | 1.50833811 | 152.353 |
| 48 | 1127.170329670 | 57.049328626 | L710 | 0.99998200 | 150.272 |
| 49 | −273.057181282 | 24.571800000 | SUPRA1 | 1.50833811 | 149.389 |
| 50 | −296.450446798 | 2.401860529 | L710 | 0.99998200 | 150.065 |
| 51 | −317.559071036 | 23.847600000 | SUPRA1 | 1.50833811 | 148.110 |
| 52 | −297.103672940 | 0.819938446 | L710 | 0.99998200 | 148.158 |
| 53 | 223.869192775 | 28.117900000 | SUPRA1 | 1.50833811 | 122.315 |
| 54 | 548.591751129 | 0.749776549 | L710 | 0.99998200 | 120.110 |
| 55 | 123.937471688 | 34.861300000 | SUPRA1 | 1.50833811 | 99.291 |
| 56 | 211.883788830 | 0.738299719 | L710 | 0.99998200 | 93.879 |
| 57 | 121.391085072 | 21.109500000 | SUPRA1 | 1.50833811 | 82.929 |
| 58 | 178.110541498 | 13.722409422 | L710 | 0.99998200 | 77.266 |
| 59 | 314.102464129 | 10.000000000 | SUPRA1 | 1.50833811 | 71.524 |
| 60 | 60.563892001 | 10.471596266 | L710 | 0.99998200 | 49.697 |
| 61 | 71.706607533 | 10.069000000 | SUPRA1 | 1.50833811 | 48.032 |
| 62 | 53.184242317 | 0.713865261 | L710 | 0.99998200 | 40.889 |
| 63 | 48.728728866 | 24.194000000 | SUPRA1 | 1.50833811 | 39.865 |
| 64 | 325.049018458 | 16.249640231 | L710 | 0.99998200 | 35.979 |
| 65 | 0.000000000 | 3.000000000 | SUPRA1 | 1.50833811 | 16.879 |
| 66 | 0.000000000 | 2.000000000 | IMMERS | 1.40000000 | 14.998 |
| 67 | 0.000000000 | 0.000000000 |  | 1.00000000 | 13.603 |

TABLE 2 j30o

| SURFACE | RADII | THICKNESSES | LENSES | REFRACTIVE INDEX 248.38 nm | ½ FREE DIAMETER |
|---|---|---|---|---|---|
| 0 | 0.000000000 | 32.000000000 |  | 1.00000000 | 54.410 |
| 1 | 0.000000000 | 10.283889256 | L710 | 0.99998200 | 61.093 |
| 2 | −2417.351767120 | 13.126300000 | SUPRA1 | 1.50833811 | 63.069 |
| 3 | −248.195466920 | 7.293007084 | L710 | 0.99998200 | 63.884 |
| 4 | −168.131361870 | 10.000000000 | SUPRA1 | 1.50833311 | 64.137 |
| 5 | 328.986124739 | 8.273191790 | L710 | 0.99998200 | 69.971 |
| 6 | 671.742152743 | 22.614900000 | SUPRA1 | 1.50833811 | 72.045 |
| 7 | −219.346865952 | 0.447882685 | L710 | 0.99998200 | 73.489 |
| 8 | 351.354459479 | 21.378800000 | SUPRA1 | 1.50833811 | 77.419 |
| 9 | −417.329819985 | 0.643718463 | L710 | 0.99998200 | 77.636 |
| 10 | 266.259242017 | 26.426700000 | SUPRA1 | 1.50833811 | 76.935 |
| 11 | −418.068287643 | 1.297611013 | L710 | 0.99998200 | 75.923 |
| 12 | 195.049526899 | 10.000000000 | SUPRA1 | 1.50833811 | 69.627 |
| 13 | 112.784218098 | 26.146948060 | L710 | 0.99998200 | 64.049 |
| 14 | −548.976305020 | 10.000000000 | SUPRA1 | 1.50833811 | 63.646 |
| 15 | 167.581609987 | 26.430913850 | L710 | 0.99998200 | 61.963 |
| 16 | −203.629259785 | 10.000000000 | SUPRA1 | 1.50833811 | 62.465 |
| 17 | 360.120642869 | 28.474843347 | L710 | 0.99998200 | 67.077 |
| 18 | −127.653905514 | 12.696400000 | SUPRA1 | 1.50833811 | 68.070 |
| 19 | −1103.725724970 | 17.347391549 | L710 | 0.99998200 | 81.856 |
| 20 | −225.898831342 | 23.521200000 | SUPRA1 | 1.50833811 | 84.765 |
| 21 | −171.063497139 | 1.525859924 | L710 | 0.99998200 | 92.671 |
| 22 | −22770.163604600 | 38.438000000 | SUPRA1 | 1.50833811 | 110.016 |
| 23 | −229.816390281 | 0.449372011 | L710 | 0.99998200 | 113.280 |
| 24 | 1170.594630540 | 38.363100000 | SUPRA1 | 1.50833811 | 123.463 |
| 25 | −320.184892150 | 0.449220757 | L710 | 0.99998200 | 124.404 |
| 26 | 335.012872058 | 39.596800000 | SUPRA1 | 1.50833811 | 124.508 |
| 27 | −764.462984962 | 0.448529485 | L710 | 0.99998200 | 123.785 |
| 28 | 270.136227728 | 25.935800000 | SUPRA1 | 1.50833811 | 113.275 |

TABLE 2-continued j30o

| SURFACE | RADII | THICKNESSES | LENSES | REFRACTIVE INDEX 248.38 nm | ½ FREE DIAMETER |
|---|---|---|---|---|---|
| 29 | 1248.618077510 | 4.599063715 | L710 | 0.99998200 | 111.173 |
| 30 | 177.093661261 | 18.578800000 | SUPRA1 | 1.50833811 | 96.787 |
| 31 | 131.459110961 | 48.903368693 | L710 | 0.99998200 | 85.123 |
| 32 | −254.431714105 | 10.000000000 | SUPRA1 | 1.50833811 | 83.644 |
| 33 | 149.734192113 | 49.544589669 | L710 | 0.99998200 | 77.792 |
| 34 | −137.204786283 | 10.000000000 | SUPRA1 | 1.50833811 | 78.174 |
| 35 | 1410.223675540 | 43.113042129 | L710 | 0.99998200 | 89.233 |
| 36 | −134.825941720 | 35.292100000 | SUPRA1 | 1.50833811 | 91.558 |
| 37 | −168.418502871 | 4.049119334 | L710 | 0.99998200 | 110.696 |
| 38 | −350.805989269 | 24.010800000 | SUPRA1 | 1.50833811 | 123.308 |
| 39 | −244.301424027 | 5.341877309 | L710 | 0.99998200 | 128.188 |
| 40 | 4941.534628580 | 43.549100000 | SUPRA1 | 1.50833811 | 146.729 |
| 41 | −357.889527255 | 4.028668923 | L710 | 0.99998200 | 148.997 |
| 42 | 1857.663670230 | 40.932000000 | SUPRA1 | 1.50833811 | 155.818 |
| 43 | −507.091567715 | −1.371361371 | L710 | 0.99998200 | 156.540 |
| 44 | 0.000000000 | 2.120040201 | L710 | 0.99998200 | 155.343 |
| 45 | 637.188120359 | 28.431900000 | SUPRA1 | 1.50833811 | 156.764 |
| 46 | −4285.746531360 | 0.447699537 | L710 | 0.99998200 | 156.510 |
| 47 | 265.928249908 | 45.432900000 | SUPRA1 | 1.50833811 | 152.266 |
| 48 | 1127.170329670 | 56.966580248 | L710 | 0.99998200 | 150.172 |
| 49 | −273.057181282 | 24.571800000 | SUPRA1 | 1.50833311 | 149.291 |
| 50 | −296.450446798 | 2.661459751 | L710 | 0.99998200 | 149.961 |
| 51 | −317.559071036 | 23.847600000 | SUPRA1 | 1.50833811 | 147.915 |
| 52 | −297.103672940 | 0.449161173 | L710 | 0.99998200 | 147.956 |
| 53 | 223.869192775 | 28.117900000 | SUPRA1 | 1.50833811 | 122.290 |
| 54 | 548.591751129 | 1.339172987 | L710 | 0.99998200 | 120.081 |
| 55 | 123.937471688 | 34.861300000 | SUPRA1 | 1.50833811 | 99.087 |
| 56 | 211.883788830 | 0.952940583 | L710 | 0.99998200 | 93.588 |
| 57 | 121.391085072 | 21.109500000 | SUPRA1 | 1.50833811 | 82.604 |
| 58 | 178.110541498 | 13.676325222 | L710 | 0.99998200 | 76.860 |
| 59 | 314.102464129 | 10.000000000 | SUPRA1 | 1.50833811 | 71.076 |
| 60 | 60.563892001 | 10.077651049 | L710 | 0.99998200 | 49.477 |
| 61 | 71.706607533 | 10.069000000 | SUPRA1 | 1.50833811 | 47.911 |
| 62 | 53.184242317 | 0.732248727 | L710 | 0.99998200 | 40.780 |
| 63 | 48.728728866 | 24.194000000 | SUPRA1 | 1.50833811 | 39.753 |
| 64 | 325.049018458 | 4.167687088 | L710 | 0.99998200 | 35.772 |
| 65 | 0.000000000 | 5.000000000 | SUPRA1 | 1.50833811 | 32.831 |
| 66 | 0.000000000 | 12.000000000 | L710 | 0.99998200 | 29.694 |
| 67 | 0.000000000 | 0.000000000 | | 1.00000000 | 13.603 |

TABLE 3 j31o

| SURFACE | RADII | THICKNESSES | LENSES | REFRACTIVE INDEX 157.63 nm | ½ FREE DIAMETER |
|---|---|---|---|---|---|
| 0 | 0.000000000 | 38.482288093 | | 1.00000000 | 85.333 |
| 1 | 304.292982078 | 22.168809366 | CAF2HL | 1.55840983 | 92.476 |
| 2 | 2741.794481050 | 96.128678854 | | 1.00000000 | 92.204 |
| 3 REFL | 0.000000000 | 0.000000000 | | −1.00000000 | 131.930 |
| 4 | 0.000000000 | −467.095641350 | | −1.00000000 | 90.070 |
| 5 | 199.893955036 | −10.268444544 | CAF2HL | −1.55840983 | 91.280 |
| 6 | 436.702942680AS | −26.734713685 | | −1.00000000 | 96.529 |
| 7 | 186.738998389 | −10.064297945 | CAF2HL | −1.55840983 | 99.240 |
| 8 | 447.975139348 | −19.001496621 | | −1.00000000 | 111.362 |
| 9 REFL | 243.529966034 | 19.001496621 | | 1.00000000 | 114.369 |
| 10 | 447.975139348 | 10.064297945 | CAF2HL | 1.55840983 | 112.384 |
| 11 | 186.738998389 | 26.734713685 | | 1.00000000 | 102.903 |
| 12 | 486.702942680AS | 10.268444544 | CAF2HL | 1.55840983 | 101.523 |
| 13 | 199.893955036 | 464.738613843 | | 1.00000000 | 96.499 |
| 14 REFL | 0.000000000 | 0.000000000 | | −1.00000000 | 115.398 |
| 15 | 0.000000000 | −100.235657635 | | −1.00000000 | 92.746 |
| 16 | −536.442986965 | −25.379215206 | CAF2HL | −1.55840983 | 94.306 |

TABLE 3-continued j31o

| | | | | | |
|---|---|---|---|---|---|
| 17 | 629.049380815 | −7.436012624 | | −1.00000000 | 93.787 |
| 18 | 0.000000000 | −118.304806660 | | −1.00000000 | 91.342 |
| 19 | −312.177007433AS | −24.720749191 | CAF2HL | −1.55840983 | 94.928 |
| 20 | −734.696609024 | −220.443381712 | | −1.00000000 | 94.168 |
| 21 | −277.004238298AS | −15.426909916 | CAF2HL | −1.55840983 | 96.206 |
| 22 | −460.130899964 | −73.782961291 | | −1.00000000 | 95.245 |
| 23 | −158.318468619 | −30.586960517 | CAF2HL | −1.55840983 | 91.460 |
| 24 | −162.867000225 | −41.632945268 | | −1.00000000 | 84.793 |
| 25 | 419.508310212 | −20.539965049 | CAF2HL | −1.55840983 | 84.016 |
| 26 | −238.581080262 | −31.955227253 | | −1.00000000 | 85.006 |
| 27 | −430.197019246 | −30.182066783 | CAF2HL | −1.55840983 | 92.237 |
| 28 | 691.939037816AS | −23.703096035 | | −1.00000000 | 93.527 |
| 29 | −241.462660758AS | −10.000000000 | CAF2HL | −1.55840983 | 97.681 |
| 30 | −182.472613831 | −25.656103361 | | −1.00000000 | 96.159 |
| 31 | −420.041190250 | −36.705938298 | CAF2HL | −1.55840983 | 98.541 |
| 32 | 324.867666879 | −43.586137768 | | −1.00000000 | 99.096 |
| 33 | −44866.873107000 | 36.893151865 | | −1.00000000 | 93.979 |
| 34 | −149.830817441 | −28.311419778 | CAF2HL | −1.55840983 | 94.246 |
| 35 | −315.631878253AS | −18.939811826 | | −1.00000000 | 91.369 |
| 36 | −172.862510793 | −12.271843841 | CAF2HL | −1.55840983 | 87.996 |
| 37 | −115.635345524 | −27.567353538 | | −1.00000000 | 81.847 |
| 33 | −229.213645994AS | −32.436472831 | CAF2HL | −1.55840983 | 82.617 |
| 39 | 474.721571790 | −3.611495525 | | −1.00000000 | 81.971 |
| 40 | −152.435372054 | −30.802088433 | CAF2HL | −1.55840983 | 75.907 |
| 41 | −530.778945822 | −8.465514650 | | −1.00000000 | 70.966 |
| 42 | −159.504999222 | −41.060952888 | CAF2HL | −1.55840983 | 63.576 |
| 43 | 3040.455878600 | −4.225976128 | | −1.00000000 | 51.729 |
| 44 | −226.630329417AS | −24.123224774 | CAF2HL | −1.55840983 | 44.179 |
| 45 | 897.778633917 | −8.617797536 | | −1.00000000 | 33.827 |
| 46 | 0.000000000 | −8.000000000 | CAF2HL | −1.55340983 | 22.352 |
| 47 | 0.000000000 | −2.000000000 | IMMERS | −1.39000000 | 18.217 |
| 48 | 0.000000000 | 0.000000000 | | −1.00000000 | 17.067 |

ASPHERIC CONSTANTS

SURFACE NO. 6

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 12

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |
| C5 | 6.78338885e−027 |
| C6 | −2.05303753e−031 |

SURFACE NO. 21

| | |
|---|---|
| K | 0.0000 |
| C1 | 1.19759751e−008 |
| C2 | 7.35438590e−014 |
| C3 | 7.03292772e−019 |
| C4 | −1.26321026e−023 |
| C5 | −3.01047364e−027 |
| C6 | 2.08735313e−031 |

SURFACE NO. 28

| | |
|---|---|
| K | 0.0000 |
| C1 | −8.39294529e−009 |
| C2 | −3.39607506e−013 |
| C3 | 8.76320979e−018 |

TABLE 3-continued j31o

| | | |
|---|---|---|
| | C4 | −1.43578199e−021 |
| | C5 | 5.59234999e−026 |
| | C6 | 2.01810948e−030 |
| | SURFACE NO. 29 | |
| | K | 0.0000 |
| | C1 | 1.74092829e−008 |
| | C2 | −1.69607632e−013 |
| | C3 | 1.18281063e−017 |
| | C4 | −3.08190938e−021 |
| | C5 | 1.70082968e−025 |
| | C6 | −1.68479126e−030 |
| | SURFACE NO. 35 | |
| | K | 0.0000 |
| | C1 | −2.14453018e−008 |
| | C2 | 6.73947641e−013 |
| | C3 | −4.84677574e−017 |
| | C4 | 5.99264335e−021 |
| | C5 | −2.87629386e−025 |
| | C6 | 3.90592520e−031 |
| | SURFACE NO. 38 | |
| | K | 0.0000 |
| | C1 | 1.60415031e−008 |
| | C2 | 4.78837509e−015 |
| | C3 | 2.08320399e−016 |
| | C4 | −2.87713700e−020 |
| | C5 | 1.77485272e−024 |
| | C6 | −1.93501550e−029 |
| | SURFACE NO. 44 | |
| | K | 0.0000 |
| | C1 | −6.56394686e−008 |
| | C2 | −8.25210588e−012 |
| | C3 | −1.27328625e−016 |
| | C4 | −1.16616292e−020 |
| | C5 | −1.58133131e−023 |
| | C6 | 6.39526832e−027 |

TABLE 4 j32o

| SURFACE | RADII | THICKNESSES | LENSES | REFRACTIVE INDEX 157.63 nm | ½ FREE DIAMETER |
|---|---|---|---|---|---|
| 0 | 0.000000000 | 36.500665837 | | 1.00000000 | 85.333 |
| 1 | 304.292982078 | 22.168809366 | CAF2HL | 1.55840983 | 92.165 |
| 2 | 2741.794481050 | 96.128678854 | | 1.00000000 | 91.891 |
| 3 REFL | 0.000000000 | 0.000000000 | | −1.00000000 | 131.415 |
| 4 | 0.000000000 | −467.820384551 | | −1.00000000 | 89.765 |
| 5 | 199.893955036 | −10.268444544 | CAF2HL | −1.55840983 | 91.269 |
| 6 | 486.702942680AS | −26.059978075 | | −1.00000000 | 96.632 |
| 7 | 186.738998389 | −10.064297945 | CAF2HL | −1.55840983 | 99.260 |
| 8 | 447.975139348 | −19.256116633 | | −1.00000000 | 111.485 |
| 9 REFL | 243.529966034 | 19.256116633 | | 1.00000000 | 114.609 |
| 10 | 447.975139348 | 10.064297945 | CAF2HL | 1.55840983 | 112.551 |
| 11 | 186.738998389 | 26.059978075 | | 1.00000000 | 103.039 |
| 12 | 486.702942680AS | 10.268444544 | CAF2HL | 1.55840983 | 101.801 |
| 13 | 199.893955036 | 465.028501331 | | 1.00000000 | 96.752 |
| 14 REFL | 0.000000000 | 0.000000000 | | −1.00000000 | 115.771 |
| 15 | 0.000000000 | −100.235657635 | | −1.00000000 | 93.044 |
| 16 | −536.442986965 | −25.379215206 | CAF2HL | −1.55840983 | 94.574 |
| 17 | 629.049380815 | −8.746601911 | | −1.00000000 | 94.056 |
| 18 | 0.000000000 | −116.715874811 | | −1.00000000 | 91.368 |
| 19 | −312.177007433AS | −24.720749191 | CAF2HL | −1.55840983 | 94.620 |
| 20 | −734.696609024 | −220.365529295 | | −1.00000000 | 93.861 |

TABLE 4-continued j32o

| | | | | | |
|---|---|---|---|---|---|
| 21 | −277.004238298AS | −15.426909916 | CAF2HL | −1.55840983 | 95.944 |
| 22 | −460.130899964 | −74.636127671 | | −1.00000000 | 94.984 |
| 23 | −158.318468619 | −30.586960517 | CAF2HL | −1.55840983 | 91.216 |
| 24 | −162.867000225 | −41.086604589 | | −1.00000000 | 84.569 |
| 25 | 419.508310212 | −20.539965049 | CAF2HL | −1.55840983 | 83.832 |
| 26 | −238.581080262 | −32.443299462 | | −1.00000000 | 84.836 |
| 27 | −430.197019246 | −30.182066783 | CAF2HL | −1.55840983 | 92.223 |
| 28 | 691.939037816AS | −22.851030925 | | −1.00000000 | 93.515 |
| 29 | −241.462660758AS | −10.000000000 | CAF2HL | −1.55840983 | 97.602 |
| 30 | −182.472613831 | −25.705407401 | | −1.00000000 | 96.085 |
| 31 | −420.041190250 | −36.705938298 | CAF2HL | −1.55840983 | 98.486 |
| 32 | 324.867666879 | −7.220642187 | | −1.00000000 | 99.044 |
| 33 | −149.830817441 | −28.311419778 | CAF2HL | −1.55840983 | 94.165 |
| 34 | −315.631878253AS | −11.206528270 | | −1.00000000 | 91.678 |
| 35 | 0.000000000 | −7.539660426 | | −1.00000000 | 92.142 |
| 36 | −172.862510793 | −12.271843841 | CAF2HL | −1.55840983 | 88.327 |
| 37 | −115.635345524 | −27.665363620 | | −1.00000000 | 82.122 |
| 38 | −229.213645994AS | −32.436472831 | CAF2HL | −1.55840983 | 82.891 |
| 39 | 474.721571790 | −3.783646156 | | −1.00000000 | 82.256 |
| 40 | −152.435372054 | −30.802088433 | CAF2HL | −1.55840983 | 76.122 |
| 41 | −530.778945822 | −8.330902516 | | −1.00000000 | 71.200 |
| 42 | −159.504999222 | −41.060952888 | CAF2HL | −1.55840983 | 63.821 |
| 43 | 3040.455878600 | −4.484154484 | | −1.00000000 | 51.982 |
| 44 | −226.630329417AS | −24.123224774 | CAF2HL | −1.55840983 | 44.183 |
| 45 | 897.778633917 | −0.971829936 | | −1.00000000 | 33.797 |
| 46 | 0.000000000 | −9.700651756 | CAF2HL | −1.55840983 | 31.743 |
| 47 | 0.000000000 | −7.828847134 | | −1.00000000 | 26.288 |
| 48 | 0.000000000 | 0.000446630 | | −1.00000000 | 17.067 |

ASPHERIC CONSTANTS

SURFACE NO. 6

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 12

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |
| C5 | 6.78338885e−027 |
| C6 | −2.05303753e−031 |

SURFACE NO. 21

| | |
|---|---|
| K | 0.0000 |
| C1 | 1.19759751e−008 |
| C2 | 7.35438590e−014 |
| C3 | 7.03292772e−019 |
| C4 | −1.26321026e−023 |
| C5 | −3.01047364e−027 |
| C6 | 2.08735313e−031 |

SURFACE NO. 28

| | |
|---|---|
| K | 0.0000 |
| C1 | −8.39294529e−009 |
| C2 | −3.39607506e−013 |
| C3 | 8.76320979e−018 |
| C4 | −1.43578199e−021 |
| C5 | 5.59234999e−026 |
| C6 | 2.01810948e−030 |

TABLE 4-continued j32o

SURFACE NO. 29

| | | |
|---|---|---|
| K | | 0.0000 |
| C1 | | 1.74092829e−008 |
| C2 | | −1.69607632e−013 |
| C3 | | 1.18281063e−017 |
| C4 | | −3.08190938e−021 |
| C5 | | 1.70082968e−025 |
| C6 | | −1.68479126e−030 |

SURFACE NO. 34

| | | |
|---|---|---|
| K | | 0.0000 |
| C1 | | −2.14453018e−008 |
| C2 | | 6.73947641e−013 |
| C3 | | −4.84677574e−017 |
| C4 | | 5.99264335e−021 |
| C5 | | −2.87629386e−025 |
| C6 | | 3.90592520e−031 |

SURFACE NO. 38

| | | |
|---|---|---|
| K | | 0.0000 |
| C1 | | 1.60415031e−008 |
| C2 | | 4.78837509e−015 |
| C3 | | 2.08320399e−016 |
| C4 | | −2.87713700e−020 |
| C5 | | 1.77485272e−024 |
| C6 | | −1.93501550e−029 |

SURFACE NO. 44

| | | |
|---|---|---|
| K | | 0.0000 |
| C1 | | −6.56394686e−008 |
| C2 | | −8.25210588e−012 |
| C3 | | −1.27328625e−016 |
| C4 | | −1.16616292e−020 |
| C5 | | −1.58133131e−023 |
| C6 | | 6.39526832e−027 |

TABLE 5 j33o

| SURFACE | RADII | THICKNESSES | LENSES | REFRACTIVE INDEX 157.63 nm | ½ FREE DIAMETER |
|---|---|---|---|---|---|
| 0 | 0.000000000 | 38.054423655 | | 1.00000000 | 85.333 |
| 1 | 304.292982078 | 22.168809366 | CAF2HL | 1.55840983 | 92.441 |
| 2 | 2741.794481050 | 96.128678854 | | 1.00000000 | 92.171 |
| 3 REFL | 0.000000000 | 0.000000000 | | −1.00000000 | 131.865 |
| 4 | 0.000000000 | −467.749539716 | | −1.00000000 | 90.082 |
| 5 | 199.893955036 | −10.268444544 | CAF2HL | −1.55840983 | 91.444 |
| 6 | 486.702942680AS | −25.540971142 | | −1.00000000 | 96.627 |
| 7 | 186.738998389 | −10.064297945 | CAF2HL | −1.55840983 | 98.903 |
| 8 | 447.975139348 | −19.398954786 | | −1.00000000 | 110.873 |
| 9 REFL | 243.529966034 | 19.398954786 | | 1.00000000 | 114.137 |
| 10 | 447.975139348 | 10.064297945 | CAF2HL | 1.55840983 | 111.985 |
| 11 | 186.738998389 | 25.540971142 | | 1.00000000 | 102.576 |
| 12 | 486.702942680AS | 10.268444544 | CAF2HL | 1.55840983 | 101.403 |
| 13 | 199.893955036 | 465.154328539 | | 1.00000000 | 96.394 |
| 14 REFL | 0.000000000 | 0.000000000 | | −1.00000000 | 115.447 |
| 15 | 0.000000000 | −100.235657635 | | −1.00000000 | 92.750 |
| 16 | −536.442986965 | −25.379215206 | CAF2HL | −1.55840983 | 94.346 |
| 17 | 629.049380815 | −8.324209221 | | −1.00000000 | 93.829 |
| 18 | 0.000000000 | −117.663111488 | | −1.00000000 | 91.238 |
| 19 | −312.177007433AS | −24.720749191 | CAF2HL | −1.55840963 | 94.838 |
| 20 | −734.696609024 | −220.431435837 | | −1.00000000 | 94.085 |
| 21 | −277.004238298AS | −15.426909916 | CAF2HL | −1.55840983 | 96.283 |
| 22 | −460.130899964 | −74.271177440 | | −1.00000000 | 95.326 |
| 23 | −158.318468619 | −30.586960517 | CAF2HL | −1.55840983 | 91.580 |

TABLE 5-continued j33o

| | | | | | |
|---|---|---|---|---|---|
| 24 | −162.867000225 | −41.410948173 | | −1.00000000 | 84.915 |
| 25 | 419.508310212 | −20.539965049 | CAF2HL | −1.55840983 | 84.171 |
| 26 | −238.581080262 | −32.165915708 | | −1.00000000 | 85.183 |
| 27 | −430.137019246 | −30.182066783 | CAF2HL | −1.55840983 | 92.511 |
| 28 | 691.939037816AS | −23.123455275 | | −1.00000000 | 93.802 |
| 29 | −241.462660758AS | −10.000000000 | CAF2HL | −1.55840983 | 97.962 |
| 30 | −182.472613831 | −25.738903727 | | −1.00000000 | 96.437 |
| 31 | −420.041190250 | −36.705938298 | CAF2HL | −1.55840983 | 98.835 |
| 32 | 324.867666879AS | −7.314163393 | | −1.00000000 | 99.389 |
| 33 | −149.830817441 | −28.311419773 | CAF2HL | −1.55840983 | 94.515 |
| 34 | −315.631878253AS | −15.768661491 | | −1.00000000 | 91.448 |
| 35 | 0.000000000 | −3.044279163 | | −1.00000000 | 91.163 |
| 36 | −172.862510793 | −12.271843841 | CAF2HL | −1.55840983 | 87.933 |
| 37 | −115.635345524 | −27.331297691 | | −1.00000000 | 81.792 |
| 38 | −229.213645994AS | −32.436472831 | CAF2HL | −1.55840983 | 82.538 |
| 39 | 474.721571790 | −4.085179748 | | −1.00000000 | 81.887 |
| 40 | −152.435372054 | −30.802088433 | CAF2HL | −1.55840983 | 75.743 |
| 41 | −530.778945822 | −8.090865960 | | −1.00000000 | 70.786 |
| 42 | −159.504999222 | −41.060952888 | CAF2HL | −1.55840983 | 63.559 |
| 43 | 3040.455878600 | −4.476231798 | | −1.00000000 | 51.715 |
| 44 | −226.630329417AS | −24.123224774 | CAF2HL | −1.55840983 | 44.004 |
| 45 | 897.778633917 | −0.971829936 | | −1.00000000 | 33.650 |
| 46 | 0.000000000 | −9.798128149 | CAF2HL | −1.55840983 | 31.626 |
| 47 | 0.000000000 | 0.000000000 | IMMERS | −1.39000000 | 26.153 |
| 48 | 0.000000000 | −7.818040520 | | −1.00000000 | 26.153 |
| 49 | 0.000000000 | 0.000266950 | | −1.00000000 | 17.067 |

ASPHERIC CONSTANTS

SURFACE NO. 6

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 12

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

SURFACE NO. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |
| C5 | 6.78338885e−027 |
| C6 | −2.05303753e−031 |

SURFACE NO. 21

| | |
|---|---|
| K | 0.0000 |
| C1 | 1.19759751e−008 |
| C2 | 7.35438590e−014 |
| C3 | 7.03292772e−019 |
| C4 | −1.26321026e−023 |
| C5 | −3.01047364e−027 |
| C6 | 2.08735313e−031 |

SURFACE NO. 28

| | |
|---|---|
| K | 0.0000 |
| C1 | −8.39294529e−009 |
| C2 | −3.39607506e−013 |
| C3 | 8.76320979e−018 |
| C4 | −1.43578199e−021 |
| C5 | 5.59234999e−025 |
| C6 | 2.01810948e−030 |

TABLE 5-continued j33o

SURFACE NO. 29

| | |
|---|---|
| K | 0.0000 |
| C1 | 1.74092829e−008 |
| C2 | −1.69607632e−013 |
| C3 | 1.18281063e−017 |
| C4 | −3.08190938e−021 |
| C5 | 1.70082968e−025 |
| C6 | −1.68479126e−030 |

SURFACE NO. 32

| | |
|---|---|
| K | 0.0000 |
| C1 | −3.60582630e−011 |
| C2 | 2.95599027e−015 |
| C3 | −7.37891981e−019 |
| C4 | 6.32721261e−023 |
| C5 | −3.13935388e−027 |
| C6 | 0.00000000e+000 |

SURFACE NO. 34

| | |
|---|---|
| K | 0.0000 |
| C1 | −2.14453013e−008 |
| C2 | 6.73947641e−013 |
| C3 | −4.84677574e−017 |
| C4 | 5.99264335e−021 |
| C5 | −2.87629386e−025 |
| C6 | 3.90592520e−031 |

SURFACE NO. 38

| | |
|---|---|
| K | 0.0000 |
| C1 | 1.60415031e−008 |
| C2 | 4.78837509e−015 |
| C3 | 2.08320399e−015 |
| C4 | −2.87713700e−020 |
| C5 | 1.77485272e−024 |
| C6 | −1.93501550e−029 |

SURFACE NO. 44

| | |
|---|---|
| K | 0.0000 |
| C1 | −6.56394686e−008 |
| C2 | −8.25210588e−012 |
| C3 | −1.27328625e−016 |
| C4 | −1.16616292e−020 |
| C5 | −1.58133131e−023 |
| C6 | 6.39526832e−027 |

The invention claimed is:

1. Lithography projection objective for imaging a pattern to be arranged in an object plane of the projection objective onto a substrate to be arranged in an image plane of the projection objective, comprising a multiplicity of optical elements that are arranged along an optical axis of the projection objective, the optical elements comprising a first group, following the object plane, of optical elements, and a last optical element, which follows the first group and is next to the image plane and which defines an exit surface of the projection objective and is arranged at a working distance from the image plane, the projection objective being tunable or tuned with respect to aberrations for the case that the volume between the last optical element and the image plane is filled by an immersion medium with a refractive index substantially greater than 1, and it being possible to adjust the position of the last optical element in the direction of the optical axis, and comprising a positioning device that positions at least the last optical element during immersion operation such that aberrations induced by disturbance are at least partially compensated.

2. The projection objective of claim 1, wherein the disturbance is to be ascribed at least partially to a variation in the immersion liquid.

3. The projection objective of claim 1, wherein the positioning device positions the last optical element during immersion operation such that in the event of disturbance arising during operation of the projection objective, the interspace filled with the immersion medium and determining the working distance is set to a nominal value at which aberrations induced by the disturbance are at least partially compensated.

4. The projection objective of claim 1, wherein the position of the substrate can be adjusted in the direction of the optical axis, and in which the positioning device adjusts the position of the last optical element in a ratio correlated to an adjustment in the position of the substrate.

5. The projection objective of claim 4, wherein the ratio is at least approximately 1:1.

6. The projection objective of claim 4, wherein the ratio is greater than or equal to 1:1.

7. The projection objective of claim 4, wherein the ratio is less than or equal to 1:1.

8. The projection objective of claim 1, wherein the positioning device is assigned a measuring device for measuring the working distance.

9. The projection objective of claim 1, wherein the projection objective has a numerical aperture NA>0.85 during immersion operation.

10. The projection objective of claim 1, wherein the positioning device has at least one actuator for adjusting the position of the last optical element in the direction of the optical axis.

11. The projection objective of claim 1, wherein the positioning device comprises at least one actuator for adjusting the position of at least one optical element from the first group.

12. The projection objective of claim 11, wherein the actuator regulates the working distance to the nominal value in cooperation with the measuring device.

13. The projection objective of claim 1, wherein the positioning device has a mount for the last optical element that upon being heated adjusts the position of the last optical element in a direction running counter to the thermal expansion of the first group of optical elements.

14. The projection objective of claim 13, wherein the mount of the last optical element has a larger coefficient of thermal expansion than the mount(s) of the first group of optical elements.

15. The projection objective of claim 1, wherein a clearance that permits a substantial axial displacement of the last optical element exists between the first group and the last optical element.

16. The projection objective of claim 1 that can be tuned largely or completely between an immersion configuration and a dry configuration by varying the thickness of the last optical element, preferably in conjunction with displacing the last optical element relative to the image plane.

17. The projection objective of claim 1, wherein the last optical element can be exchanged.

18. The projection objective of claim 1, wherein the last optical element comprises a number of mutually detachable components that are arranged at a spacing from one another or are interconnected in an optically neutral fashion, components of the last optical element preferably consisting of different optical materials, at least one component preferably consisting of fluoride crystal, in particular of lithium fluoride or calcium fluoride.

19. The projection objective of claim 1, wherein the last optical element has a flat exit surface.

20. The projection objective of claim 1, wherein the optical material, adjoining the exit surface, of the last optical element has a refractive index $n_E$ that is close to the refractive index $n_I$ of the immersion medium, a ratio $n_I/n_E$ preferably being more than 0.8, in particular more than 0.9.

21. The projection objective of claim 1, wherein the optical elements of the first group comprise at least one displaceable optical element, a number of, in particular at least five, displaceable optical elements preferably being provided, and/or at least one of the displaceable optical elements being displaceable along the optical axis.

22. The projection objective of claim 21, wherein a free distance upstream of the displaceable element and/or downstream of the displaceable element is dimensioned to be so large that it is possible by displacing the at least one displaceable optical element to correct at least a fraction of aberrations that result from adapting the last optical element to an immersion medium.

23. The projection objective of claim 1 that is assigned at least one exchangeable optical correction element that preferably has at least one aspheric surface.

24. The projection objective of claim 1, wherein at least one optical element of the first group has at least one optical surface with a reversibly or permanently variable surface curvature.

25. The projection objective of claim 1 that has an image-side numerical aperture NA<1 given the use of an immersion medium between the exit surface and image plane, the image-side numerical aperture preferably being between approximately 0.7 and 1.0, in particular between 0.8 and 1.0.

26. The projection objective of claim 1, wherein the last optical element can be removed from the projection objective and be replaced by a plane-parallel plate that is large by comparison with the exit surface of the projection objective and can be laid over a large area onto an object to be exposed.

27. The projection objective of claim 1 that is a purely dioptric (refractive) projection objective, or that is a catadioptric projection objective, in particular having at least one real intermediate image, the catadioptric projection objective preferably having a physical beam splitter or geometric beam splitter.

28. The projection objective of claim 1, wherein the positioning leaves the volume of the immersion medium at least approximately invariant.

29. A method for correcting image defects in the case of a lithography projection objective that is tunable to immersion operation, in which the projection objective serves the purpose of projecting a pattern arranged in an object plane of the projection objective onto a substrate arranged in an image plane of the projection objective, wherein the projection objective has a multiplicity of optical elements that are arranged along an optical axis of the projection objective, the optical elements comprising a first group, following the object plane, of optical elements, and a last optical element, which follows the first group and is next to the image plane and which defines an exit surface of the projection objective and is arranged at a working distance from the image plane, in which the volume between the last optical element and the image plane can be filled with an immersion medium, in the event of disturbance arising during immersion operation of the projection objective at least the last optical element being positioned such that aberrations induced by the disturbance are at least partially compensated.

30. The method of claim 29, wherein the disturbance is to be ascribed at least partially to a variation in the immersion liquid.

31. The method of claim 29, wherein the last optical element is positioned during immersion operation such that in the event of disturbance arising during operation of the projection objective, the interspace filled with the immersion medium and filling the working distance is set to a nominal value at which aberrations induced by the disturbance are at least partially compensated.

32. The method of claim 29, wherein the positions of the last optical element and the substrate are mutually adjusted in a correlated ratio in the direction of the optical axis.

33. The method of claim 32, wherein the positions of the last optical element and the substrate are adjusted in the same sense in the direction of the optical axis.

34. The method of claim 32, wherein the ratio is at least approximately 1:1.

35. The method of claim 32, wherein the ratio is greater than or equal to 1:1.

36. The method of claim 32, wherein the ratio is less than or equal to 1:1.

37. The method of claim 29, wherein in a first step only the position of the last optical element is adjusted in the direction of the optical axis in order to restore a predetermined desired working distance, and in a second step the position of the last optical element and the position of the substrate are adjusted in the direction of the optical axis, preferably in the ratio of 1:1.

38. The method of claim 29, wherein in a first step the position of the last optical element and the position of the substrate are adjusted in the direction of the optical axis, preferably in the ratio of 1:1, and wherein in a second step only the position of the last optical element is adjusted in the direction of the optical axis in order to restore a predetermined desired working distance.

39. The method of claim 29, wherein the last optical element is positioned such that it is subsequently possible to compensate aberrations at least largely solely by adjusting the position of the substrate.

40. The method of claim 29, wherein the working distance is measured before and/or during operation of the projection objective, the position of the last optical element and/or the position of the substrate being adjusted as a function of the measurement in order to readjust the working distance to the set point.

* * * * *

UNITED STATES PATENT AND TRADEMARK OFFICE
CERTIFICATE OF CORRECTION

PATENT NO. : 7,463,423 B2
APPLICATION NO. : 11/955662
DATED : December 9, 2008
INVENTOR(S) : Ulrich Loering et al.

It is certified that error appears in the above-identified patent and that said Letters Patent is hereby corrected as shown below:

Column 15-16 (Table 1), line 12 (Col. 6), delete "77.686" insert --77.668--.

Column 15-16 (Table 1), line 14 (Col. 3), delete "0.747164753" insert --0.747164785--.

Column 15-16 (Table 1), line 19 (Col. 5), delete "1.50333811" insert --1.50833811--.

Column 15-16 (Table 1), line 20 (Col. 6), delete "86.965" insert --66.965--.

Column 15-16 (Table 1), line 21 (Col. 6), delete "88.153" insert --68.153--.

Column 15-16 (Table 1), line 31 (Col. 1), delete "23" insert --28--.

Column 17-18 (Table 1-continued), line 5 (Col. 2), delete "188.413502871" insert --168.418502871--.

Column 17-18 (Table 2), line 7 (Col. 5), delete "1.50833311" insert --1.50833811--.

Column 17-18 (Table 2), line 18 (Col. 3), delete "26.430913850" insert --26.480913850--.

Column 19-20 (Table 2-continued), line 3 (Col. 2), delete "177.093661261" insert --177.098661261--.

Column 19-20 (Table 2-continued), line 19 (Col. 3), delete "0.447699537" insert --0.447699567--.

Column 19-20 (Table 3), line 9 (Col. 2), delete "436.702942680AS" insert --486.702942680AS--.

Column 21-22 (Table 3-continued), line 22 (Col. 1), delete "33" insert --38--.

Column 21-22 (Table 3-continued), line 30 (Col. 5), delete "1.55340983" insert --1.55840983--.

UNITED STATES PATENT AND TRADEMARK OFFICE
CERTIFICATE OF CORRECTION

PATENT NO. : 7,463,423 B2
APPLICATION NO. : 11/955662
DATED : December 9, 2008
INVENTOR(S) : Ulrich Loering et al.

It is certified that error appears in the above-identified patent and that said Letters Patent is hereby corrected as shown below:

Column 23-24 (Table 4), line 4 (Col. 6), delete "92.165" insert --95.166--.

Signed and Sealed this

Tenth Day of February, 2009

JOHN DOLL
*Acting Director of the United States Patent and Trademark Office*